(12) United States Patent
Zhai et al.

(10) Patent No.: US 10,693,090 B2
(45) Date of Patent: Jun. 23, 2020

(54) FLEXIBLE DISPLAY PANEL AND DISPLAY DEVICE

(71) Applicant: SHANGHAI TIANMA MICRO-ELECTRONICS CO., LTD., Shanghai (CN)

(72) Inventors: Yingteng Zhai, Shanghai (CN); Yong Wu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/167,465

(22) Filed: Oct. 22, 2018

(65) Prior Publication Data

US 2019/0103569 A1 Apr. 4, 2019

(30) Foreign Application Priority Data

Jul. 9, 2018 (CN) .......................... 2018 1 0743022

(51) Int. Cl.
*H01L 35/24* (2006.01)
*H01L 51/00* (2006.01)
(Continued)

(52) U.S. Cl.
CPC ...... *H01L 51/0097* (2013.01); *H01L 51/5253* (2013.01); *H01L 27/3276* (2013.01);
(Continued)

(58) Field of Classification Search
CPC ............. H01L 51/5253; H01L 51/0097; H01L 27/3276; H01L 51/6256; H01L 51/5256
See application file for complete search history.

(56) References Cited

U.S. PATENT DOCUMENTS

| 9,929,374 B2 * | 3/2018 | Jin ...................... H01L 51/5246 |
| 2016/0218305 A1 | 7/2016 | Kim et al. |
| 2019/0189639 A1 | 6/2019 | Zuo et al. |

FOREIGN PATENT DOCUMENTS

| CN | 105826350 A | 8/2016 |
| CN | 106601133 A | 4/2017 |

(Continued)

OTHER PUBLICATIONS

Office Action of Chinese Patent Application No. 201810743022.5 dated Dec. 11, 2019.

*Primary Examiner* — Samuel A Gebremariam
(74) *Attorney, Agent, or Firm* — Kilpatrick Townsend & Stockton, LLP

(57) ABSTRACT

A flexible display panel and a display device are provided. The flexible display panel includes a flexible substrate, and an inorganic film layer located on the flexible substrate. The inorganic film layer includes a first portion and a second portion. The first portion is connected with the second portion, and the first portion has a first thickness T1. Further, the second portion has a second thickness T2, and T1<T2, and the first portion includes at least one first sub-portion and at least one second sub-portion. The first sub-portion is smoothly connected with the second sub-portion at a boundary line extending in a first direction, and from the boundary line, a dimension of the second sub-portion in the first direction gradually changes in a direction away from the first sub-portion.

19 Claims, 18 Drawing Sheets

(51) Int. Cl.
  *H01L 51/52*         (2006.01)
  *H01L 27/32*         (2006.01)
(52) U.S. Cl.
  CPC .... *H01L 51/5256* (2013.01); *H01L 2251/301* (2013.01); *H01L 2251/5338* (2013.01); *H01L 2251/5346* (2013.01); *H01L 2251/556* (2013.01); *H01L 2251/558* (2013.01)

(56)         References Cited

FOREIGN PATENT DOCUMENTS

| | | |
|---|---|---|
| CN | 106784377 A | 5/2017 |
| CN | 106848108 A | 6/2017 |
| CN | 206516661 U | 9/2017 |
| CN | 107424520 A | 12/2017 |
| CN | 107994036 A | 5/2018 |
| CN | 108231855 A | 6/2018 |

\* cited by examiner

FLEXIBLE DISPLAY PANEL AND DISPLAY DEVICE

CROSS REFERENCE OF RELATED APPLICATION

This application claims the priority to Chinese Patent Application No. 201810743022.5, titled "FLEXIBLE DISPLAY PANEL AND DISPLAY DEVICE", filed on Jul. 9, 2018 with the Chinese Patent Office, which is incorporated herein by reference in its entirety.

FIELD

The present disclosure relates to the field of display, and in particular to a flexible display panel and a display device.

BACKGROUND

A display panel is generally manufactured by laminating film layers. Considering factors such as a sealing performance and a thickness of the display panel, the display panel usually includes film layers formed by inorganic material. Compared with the film layer formed by organic material, the film layer formed by inorganic material has poor stress resistance and is prone to crack under stress, which brings a great hidden trouble to performance reliability of the display panel. Therefore, an urgent problem to be solved is to eliminate the influence on the performance reliability of the display panel caused by the film layers formed by the inorganic material.

SUMMARY

In view of this, a flexible display panel and a display device are provided according to the embodiments of the present disclosure, so as to solve the problem that an inorganic film layer influences performance reliability of the display panel and to improve the performance reliability of the display panel.

In one embodiment, a flexible display panel is provided according to the embodiments of the present disclosure. The flexible display panel includes: a flexible substrate and an inorganic film layer located on the flexible substrate.

The inorganic film layer includes a first portion and a second portion, the first portion is connected with the second portion, the first portion has a first thickness T1, the second portion has a second thickness T2, and T1<T2.

The first portion includes at least one first sub-portion and at least one second sub-portion, the first sub-portion is connected with the second sub-portion at a boundary line extending in a first direction, a length of an end of the first sub-portion at the boundary line in first direction is the same as a length of an end of the second sub-portion at the boundary line in the first direction such that the end of the first sub-portion smoothly joins with the end of the second sub-portion at the boundary line, and from the boundary line, a dimension of the second sub-portion in the first direction gradually changes in a direction away from the first sub-portion.

In another embodiment, a display device is provided according to the embodiments of the present disclosure. The display device includes a flexible display panel provided according to any one of the embodiments of the present disclosure.

Compared with the conventional technology, the flexible display panel and the display device provided according to the embodiments of the present disclosure at least include following beneficial effects.

In the flexible display panel provided according to the embodiments of the present disclosure, an inorganic film layer includes a first portion having a first thickness T1 and a second portion having a second thickness T2, where T1<T2. That is, the first portion of the inorganic film layer is thinned. When the flexible display panel is bended, a radius of curvature of a region corresponding to the first portion is usually less than a radius of curvature of a region corresponding to the second portion. Therefore, compared with the second portion, the first portion is subject to greater stress, at an edge of the first portion where the probability of generating cracks is further increased. By providing the second sub-portion having a gradually changing dimension at an end of the first sub-portion, stress distribution near the end of the first sub-portion is adjusted, such that a possibility of generating cracks in the inorganic film layer is reduced while good bending performance of the flexible display panel is ensured, thereby improving the performance reliability of the flexible display panel and the display device.

DETAILED DESCRIPTION

Figure 1:
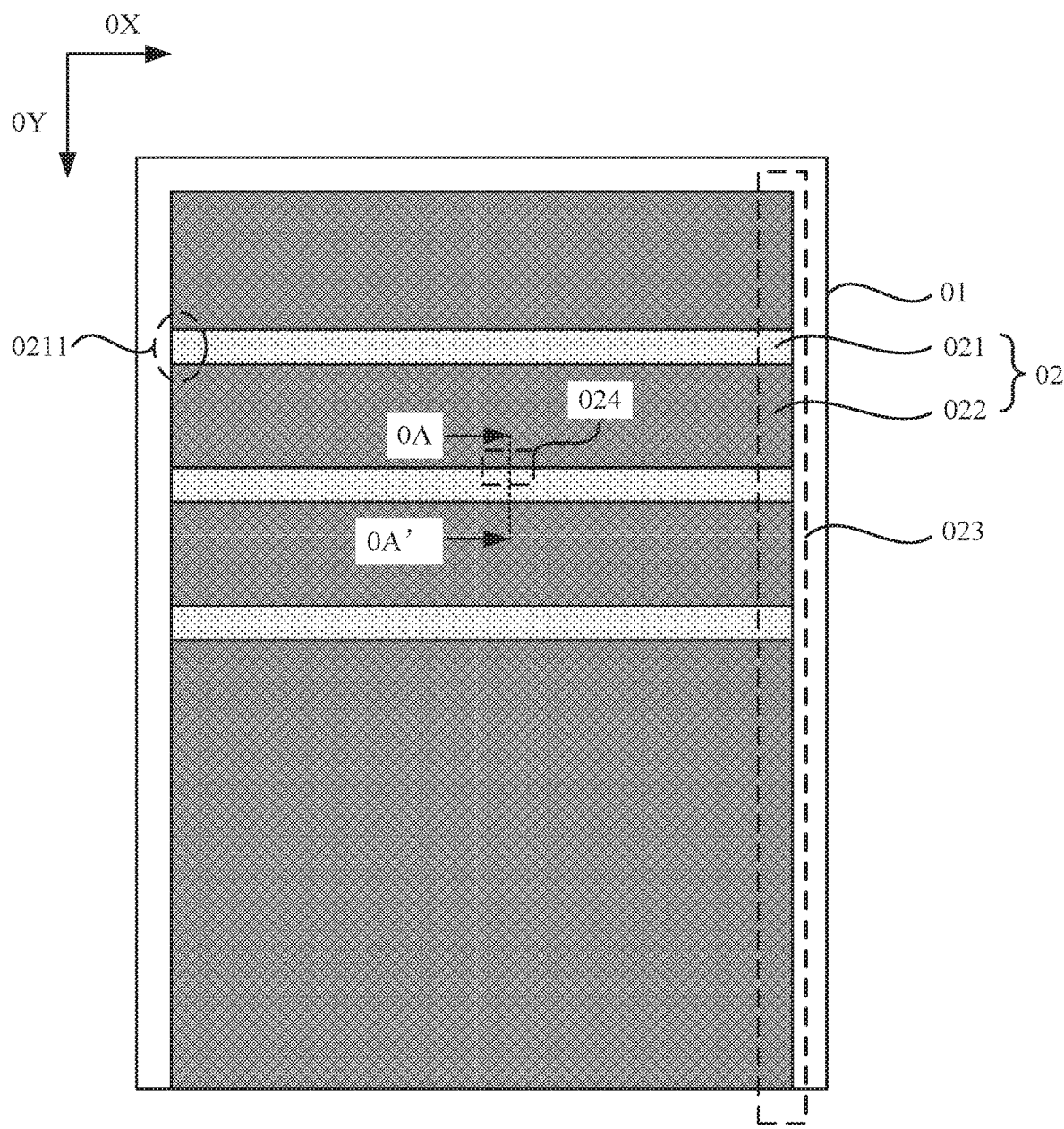
FIG. 1 is a top view of a flexible display panel according to the conventional technology.
Figure 2:
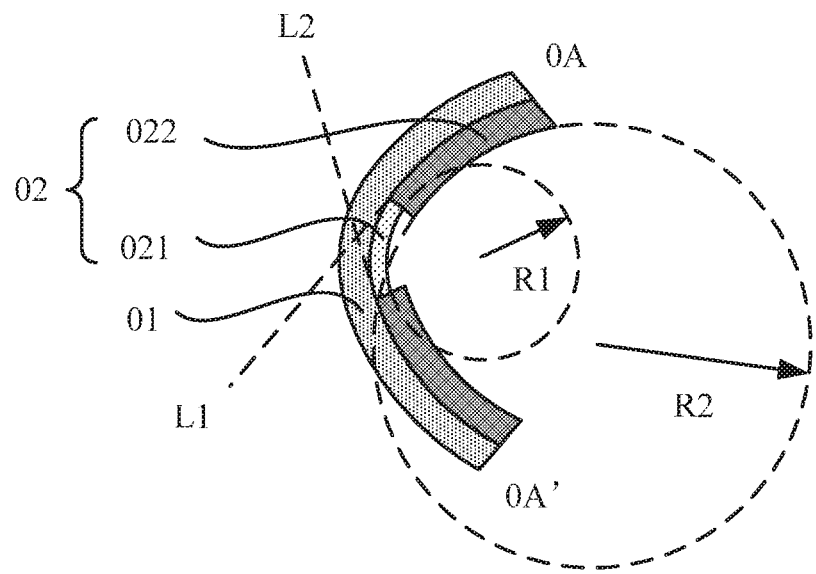
FIG. 2 is a cross-sectional view of a bended flexible display panel according to the conventional technology taken along a line OA-OA' in FIG. 1.
Figure 3:
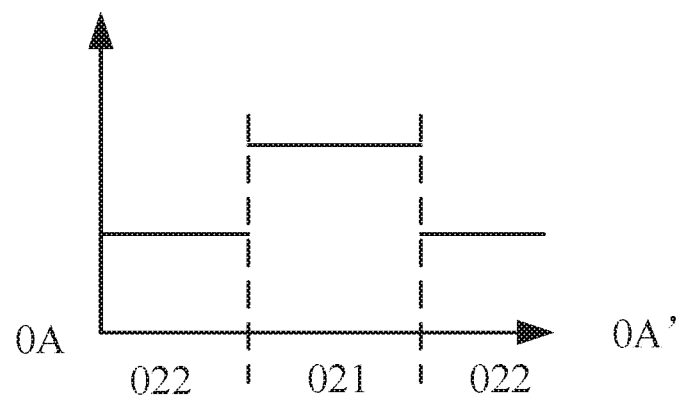
FIG. 3 is a schematic diagram of a stress distribution of an inorganic film layer in a direction of OA-OA' in FIG. 2.

FIG. 1 is a top view of a flexible display panel according to the conventional technology. FIG. 2 is a cross-sectional view of a bended flexible display panel according to the conventional technology taken along a line OA-OA' in FIG. 1. FIG. 3 is a schematic diagram of a stress distribution of an inorganic film layer in a direction of OA-OA' in FIG. 2. A vertical coordinate in FIG. 3 represents a stress value.

As shown in FIGS. 1 to 3, the flexible display panel includes a flexible substrate 01 and an inorganic layer 02 located on the flexible substrate 01. The inorganic layer 02 includes multiple first portions 021 and multiple second portions 022. The first portion 021 is connected with the second portion 022. A thickness of the first portion 021 is less than a thickness of the second portion 022. The first portion 021 has a strip shape, and extends in a direction OX. The first portions 021 and the second portions 022 are arranged in a direction OY. The direction OX is perpendicular to the direction OY.

The inorganic layer 02 has poor stress resistance, and is prone to crack under stress, at an edge of the inorganic layer 02 (as shown in a dotted box 023 in FIG. 1).

In a case that the flexible display panel is bended in the direction OY around a bending axle in the direction OX, a radius of curvature R1 of the first portion 021 is less than a radius of curvature R2 of the second portion 022 since the thickness of the first portion 021 is less than the thickness of the second portion 022. Therefore, as shown in FIG. 2, the flexible display panel may be bended without affecting components arranged in a region where the second portion 022 is located. However, since the radius of curvature R1 of the first portion 021 is less than the radius of curvature R2 of the second portion 022, a stress received by the first portion 021 is greater than a stress received by the second portion 022. Reference is made to FIG. 3. As compared with the second portion 022, the stress is concentrated in the first portion 021 when the flexible display panel is bended, in which case the first portion 021 becomes a stress concentration region. In addition, a remarkable difference in the stress distribution occurs in a region where the first portion 021 is connected with the second portion 022 (as shown in a dotted box 024 shown in FIG. 1), in which case this region becomes a stress concentration point. A stress concentration region and a stress concentration point in the inorganic layer are prone to crack.

It may be known based on above description that an end of the first portion 021 (as shown in a dotted circle 0211 shown in FIG. 1) in the inorganic layer 02 is highly prone to crack. Further, a crack generated at the end of the first portion 021 easily extends into the flexible display panel along the inorganic layer 02. In a case that the inorganic layer 02 is a package film layer, ambient moisture and oxygen may invade into the flexible display panel along a crack path, and cause component failure inside the flexible display panel in serious cases. In a case that the inorganic layer 02 is an electrical insulating layer, insulation between conducting layers on upper and lower sides of the inorganic layer 02 may be affected, and the performance reliability of the flexible display panel is influenced.

In order to solve the above technical problem, a flexible display panel and a display device are provided according to the embodiments of the present disclosure so as to solve the problem that the inorganic layer affects the performance reliability of the flexible display panel.

Figure 4:
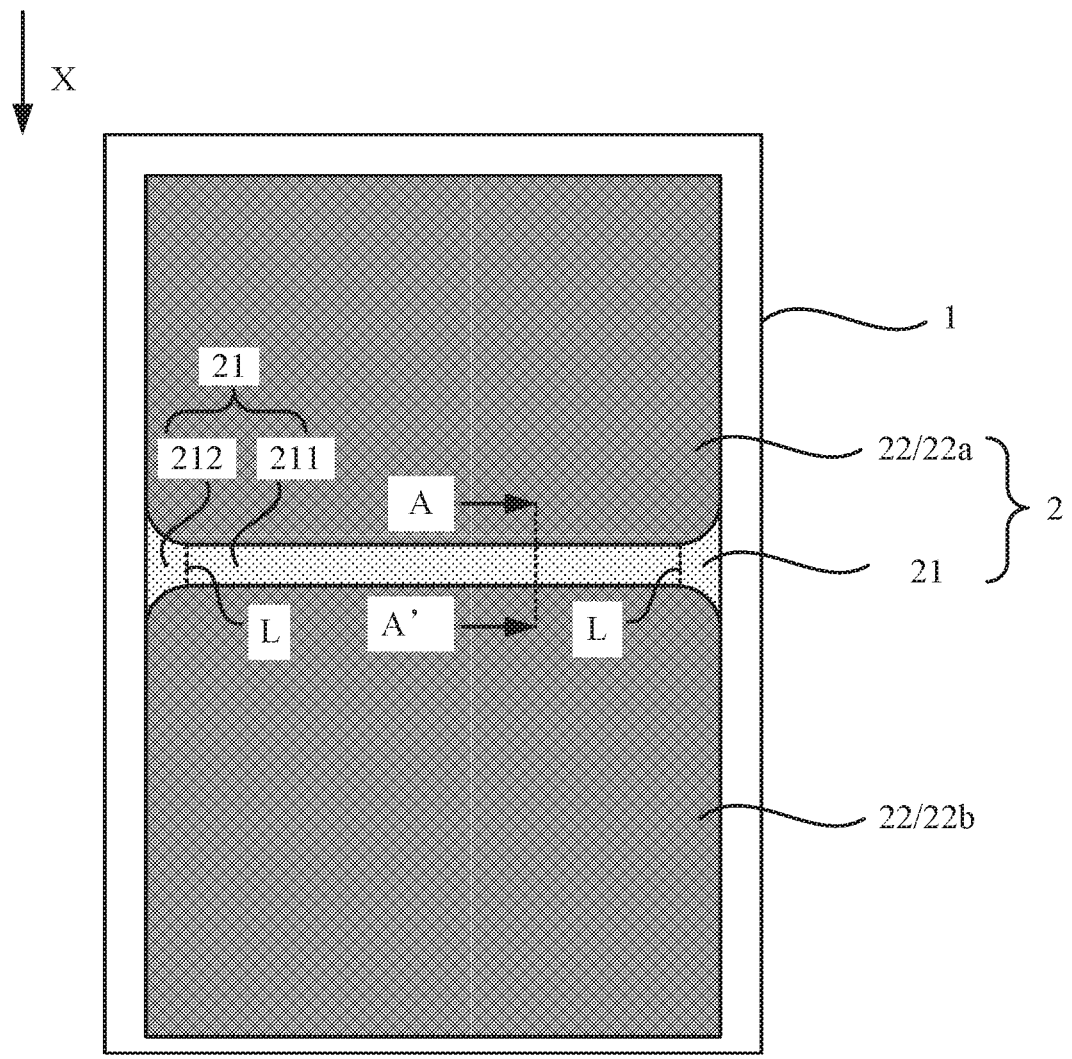
FIG. 4 is a top view of a flexible display panel according to an embodiment of the present disclosure.
Figure 5:
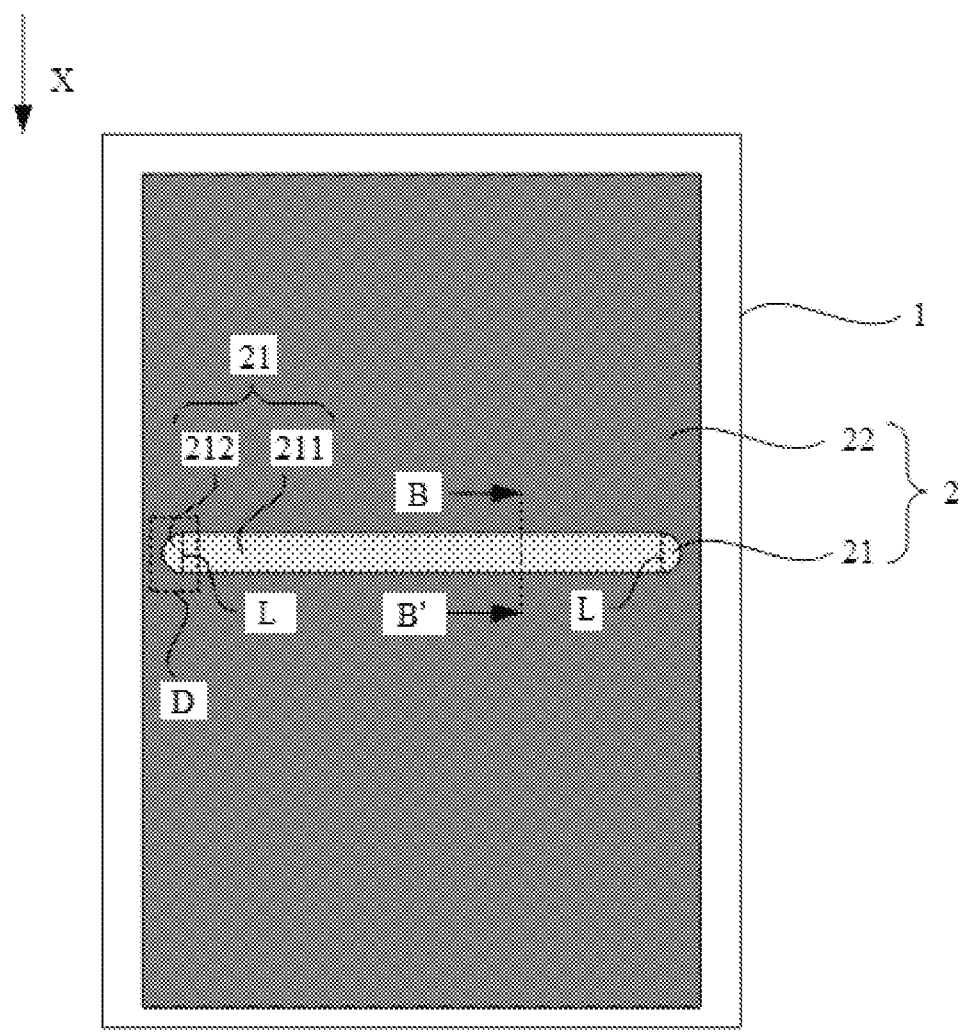
FIG. 5 is a top view of a flexible display panel according to an embodiment of the present disclosure.
Figure 6:
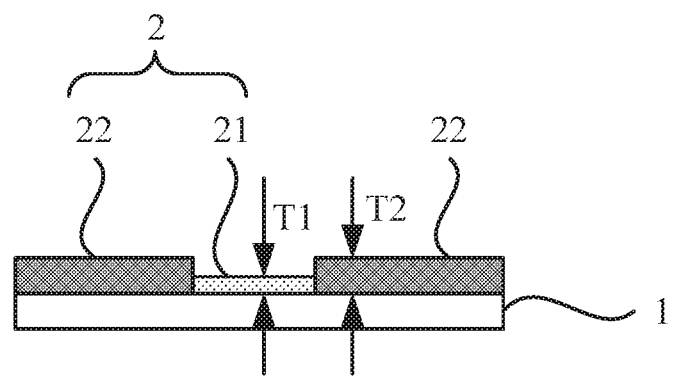
FIG. 6 is a cross-sectional view taken along a line AA' in FIG. 4 or taken along a line BB' in FIG. 5.

FIG. 4 is a top view of a flexible display panel according to an embodiment of the present disclosure. FIG. 5 is a top view of a flexible display panel according to an embodiment of the present disclosure. FIG. 6 is a cross-sectional view taken along a line AA' in FIG. 4 or taken along a line BB' in FIG. 5.

As shown in FIGS. 4 to 6, the flexible display panel provided according to the embodiments of the present disclosure includes a flexible substrate 1 and an inorganic film layer 2. The inorganic film layer 2 is located on the flexible substrate 1. The inorganic film layer 2 includes a first portion 21 and a second portion 22. The first portion 21 is connected with the second portion 22. The first portion 21 has a first thickness T1, the second portion 22 has a second thickness T2, and T1<T2. The first portion 21 includes at least one first sub-portion 211 and at least one second sub-portion 212. The first sub-portion 211 is connected with the second sub-portion 212 at a boundary line L which extends in a first direction X. A length of an end of the first sub-portion at the boundary line in first direction is the same as a length of an end of the second sub-portion at the boundary line in the first direction such that the end of the first sub-portion smoothly joins with the end of the second sub-portion at the boundary line. From the boundary line L, a dimension of the second sub-portion 212 in the first direction X gradually changes in a direction away from the first sub-portion 211. The first direction X is parallel to a direction of a plane where the flexible substrate 1 is located, and the first direction X may be perpendicular to a direction in which the first sub-portion 211 extends.

In one embodiment, in the flexible display panel provided according to the embodiments of the present disclosure, the flexible substrate 1 is used as a substrate. Compared with the substrate made of hard material such as glass, the flexible substrate 1 enables the flexible display panel to be bended, folded, or curled, etc., which meets diverse needs of users. The flexible substrate 1 may be made of polyimide, which is not limited herein.

The inorganic film layer 2 may be used as a sealing film layer for improving sealing performance of the flexible display panel and preventing the ambient moisture and oxygen from invading into the flexible display panel. In one embodiment, the inorganic film layer 2 may be used as an insulating layer such that the conducting layers on opposite sides of the inorganic film layer 2 are insulated from each other. In the embodiments of the present disclosure, the inorganic film layer 2 may be made of at least one of silicon oxide and silicon nitride, or a mixture of silicon oxide and silicon nitride and other materials, which is not limited herein.

The inorganic film layer 2 is located on the flexible substrate 1, and the inorganic film layer 2 and the flexible substrate 1 are laminated with each other. The inorganic film layer 2 may be directly formed on a surface of the flexible substrate 1. A surface of the inorganic film layer 2 is in direct contact with the surface of the flexible substrate 1. In one embodiment, other film layers may be arranged between the inorganic film layer 2 and the flexible substrate 1. It should be noted that film layers other than the inorganic film layer 2 in the flexible display panel are not shown in FIG. 6 for illustrating the structure of the inorganic film layer 2.

The inorganic film layer 2 includes the first portion 21 having the first thickness T1 and the second portion 22 having the second thickness T2. The first portion 21 is connected with the second portion 22. That is, the first portion 21 is a thinned region of the inorganic film layer. As an example, the first portion 21 of the inorganic film layer 2 may be formed by etching the inorganic film layer 2 by using a halftone process. It should be noted that the thickness of the first portion and the thickness of the second portion indicate dimensions of the first portion and the second portion in a direction perpendicular to the plane of the flexible substrate.

Figure 7:
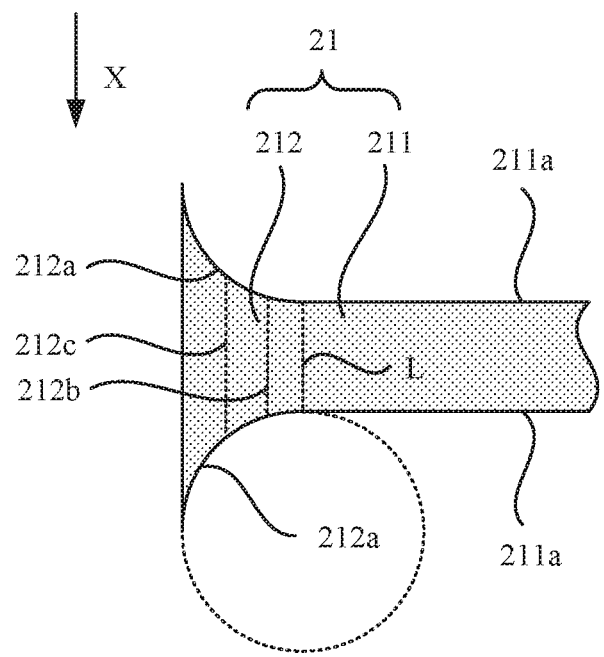
FIG. 7 is a partially schematic view of a first portion according to an embodiment of the present disclosure.
Figure 8:
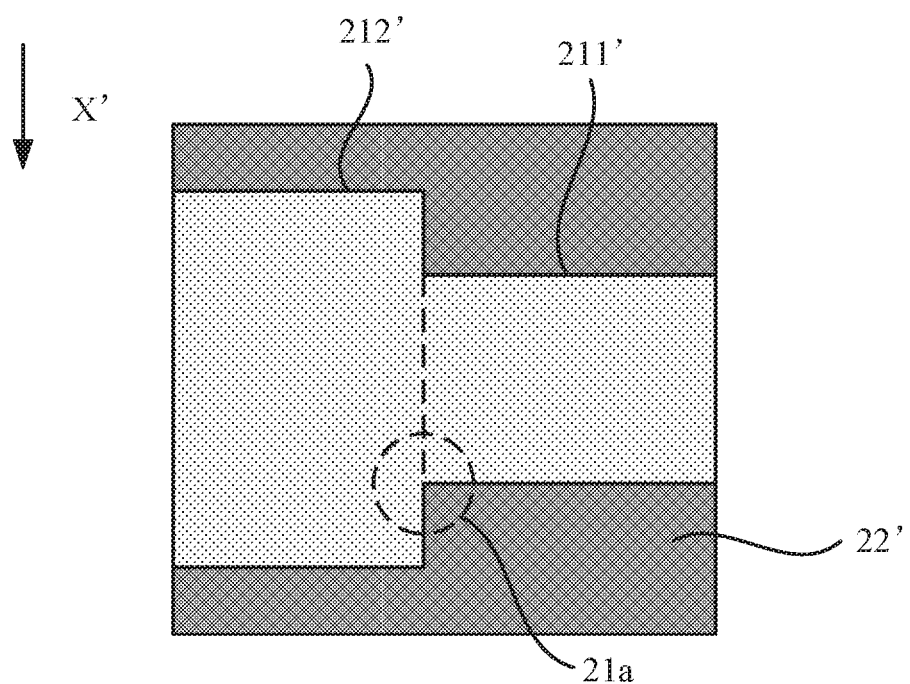
FIG. 8 is a comparison diagram for FIG. 7.

FIG. 7 is a partially schematic view of a first portion according to an embodiment of the present disclosure. FIG. 8 is a comparison diagram for FIG. 7. References is made to FIG. 4 in conjunction with FIGS. 7 and 8, the first portion 21 of the inorganic film layer 2 includes the first sub-portion 211 and the second sub-portion 212. The first sub-portion 211 is connected with the second sub-portion 212, and the second sub-portion 212 has a shape having a gradually changing dimension. In one embodiment, the first portion 211 may have a strip shape, and an end of the first sub-portion 211 (see a region limited by a dotted box 0211 in FIG. 1) is connected with the second sub-portion 212. A side 211*a* of the first sub-portion 211 at which the first sub-portion 211 is connected with the second portion 22 and a side 212*a* of the second sub-portion 212 at which the second sub-portion 212 is connected with the second portion 22 are smoothly connected at the boundary line L between the first sub-portion 211 and the second sub-portion 212. That is, a case where the side 212*a* is at a right angle to the side 211*a* is not included. As shown by a region 21*a* in FIG. 8, in a case that the flexible display panel is bended in a direction X', a stress received by a portion 212' is different from a stress received by a portion 211', and a stress received by a portion 22' connected with the portion 212' and the portion 211' in the region 21*a* is significantly different from the stress received by the portion 212' and the stress received by the portion 211', hence a stress concentration point is easily generated in the region 21*a*. In contrast, smooth connection between the side 212*a* and the side 211*a* at the boundary line can relieve or eliminate the stress concentration point near the boundary line L.

In addition, the side 212*a* of the second sub-portion 212 at which the second sub-portion 212 is connected with the second portion 22 is a smooth line at a position where the dimension of the second sub-portion 212 changes gradually. That is, the side 212*a* does not have a portion parallel to the first direction X, thereby avoiding a case where the dimension of the second sub-portion 212 in the first direction X abruptly changes in the direction away from the first sub-portion 211, for example, the side 212*a* is a curve or a straight line, such that appearance of the stress concentration points can be reduced.

By arranging the second sub-portion having the gradually changing shape in the inorganic film layer, the second sub-portion, as a stress distribution transition region, adjusts the stress distribution near the end of the first sub-portion so as to reduce or avoid the appearance of the stress concentration region and the stress concentration point at the edge of the inorganic film layer, thereby reducing the probability of generating cracks at the edge of the inorganic film layer and improving the performance reliability of the flexible display panel. The dimension of the second sub-portion in the first direction may gradually increase or decrease in the direction away from the first sub-portion 211.

A case where the dimension of the second sub-portion gradually increases is described as follows.

Figure 9:
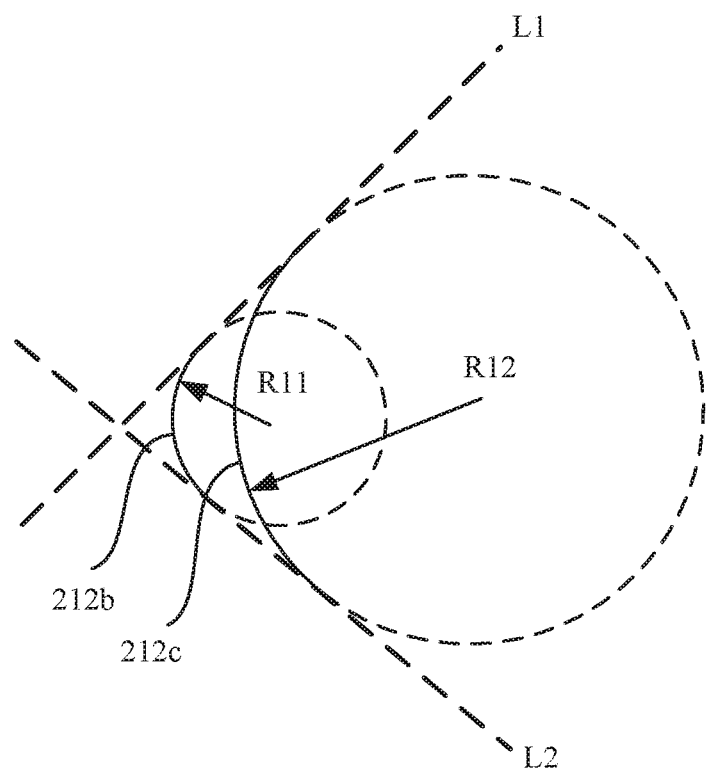
FIG. 9 is a schematic diagram showing bending curves at different locations of a second sub-portion in FIG. 7.

FIG. 9 is a schematic diagram showing bending curves at different locations of the second sub-portion in FIG. 7. In one embodiment, FIG. 9 is a schematic diagram showing bending curves at a position 212*b* and a position 212*c* of the second sub-portion 212 in FIG. 7.

FIG. 4 shows a case where the dimension of the second sub-portion gradually increases in the direction away from the first sub-portion. As shown in FIGS. 4, 7 and 9, the second sub-portion 212 and the first sub-portion 211 are connected in a direction perpendicular to the first direction X, and in the first direction X, the second portion 22 is connected with the first sub-portion 211 and the second sub-portion 212. From the boundary line L, the dimension of the second sub-portion 212 in the first direction X gradually increases in the direction away from the first sub-portion 211. In a case that the flexible display panel is bended in the first direction X, the bending axle of the flexible display panel may extend in a direction parallel to the direction in which the first sub-portion extends, and a tangent of a second portion 22*a* that is connected with one side of the second sub-portion 212 at a position where the second portion 22*a* and the second sub-portion 212 are connected (see a tangent L1 in FIG. 2) is at a certain angle with a tangent of a second portion 22*b* that is connected with the other side of the second sub-portion 212 at a position where the second portion 22*b* and the second sub-portion 212 are connected (see a tangent L2 in FIG. 2). In a case of a constant angle, a greater dimension of the second sub-portion 212 in the first direction X corresponds to a greater radius of curvature corresponding to the second sub-portion 212. For example, in a case that the angle between the tangent L1 and the tangent L2 is constant, a radius of curvature of a bending curve corresponding to a position 212*b* where the dimension of the second sub-portion 212 in the first direction is smaller is R11, a radius of curvature of a bending curve corresponding to a position 212*c* where the dimension of the second sub-portion 212 in the first direction is greater is R12, and R12 is greater than R11, a stress received by the position 212*c* of the second sub-portion 212 is less than a stress received by the position 212*b* of the second sub-portion 212. Since the thickness of the second portion 22 is greater than the thickness of the first portion 21, in a case that external stresses change at the same rate, a deformation rate of the second portion 22 is less than a deformation rate of the first portion 21. That is, compared with the first portion 21, the second portion 22 is more difficult to deform. Hence, the angle between the tangent corresponding to the second portion 22*a* and the tangent corresponding to the second portion 22*b* is approximately constant in the direction away from the first sub-portion 211. Further, since the dimension of the second sub-portion 212 in the first direction X gradually increases in the direction away from the first sub-portion 211, the radius of curvature corresponding to the second sub-portion 212 gradually increases in the direction away from the first sub-portion 211, and the stress received by the second sub-portion 212 gradually decreases in the direction away from the first sub-portion 211. Therefore, at the edge of the inorganic film layer 2, near the end of the first sub-portion 211, the stress concentration is relieved. In addition, the stress distribution difference at the position where the second sub-portion 212 and the second portion 22 are connected gradually decreases in the direction away from the first sub-portion 211, thereby reducing a degree of the stress distribution difference at the position where the first portion 21 is connected with the second portion 22 and eliminating the stress concentration point at this position, which is beneficial to reducing the probability of generating cracks at the edge of the inorganic film layer 2 and improving the performance reliability of the flexible display panel.

A shape of a side of the second sub-portion is described as follows.

Figure 10:
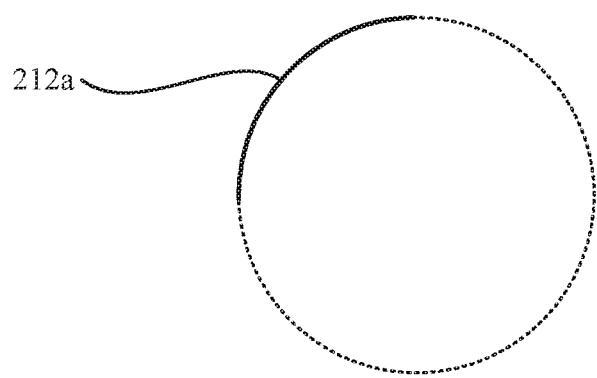
FIG. 10 is a schematic diagram showing a shape of a first side according to an embodiment of the present disclosure.
Figure 11:
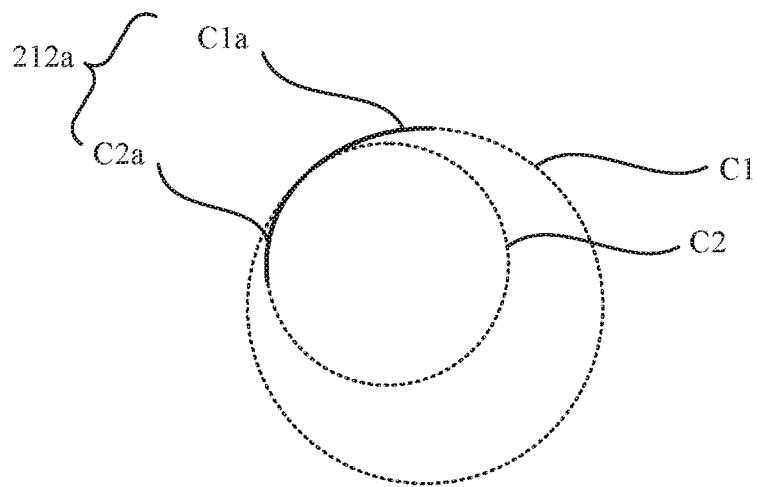
FIG. 11 is a schematic diagram showing a shape of a first side according to an embodiment of the present disclosure.

FIG. 10 is a schematic diagram showing a shape of a first side according to an embodiment of the present disclosure, and FIG. 11 is a schematic diagram showing a shape of a first side according to an embodiment of the present disclosure.

A first side of the second sub-portion may have an arc shape. As shown in FIGS. 7, 10 and 11, the second sub-portion 212 has at least one first side 212a. The first side 212a is connected with the boundary line L, and has an arc shape. In one embodiment, the arc shape of the first side may be formed by an arc of one circle between two points, or by arcs of multiple circles. FIG. 10 illustrates a case that the arc shape of the first side 212a is formed by an arc of one circle between two points, and FIG. 11 illustrates a case that the arc shape of the first side 212a is formed by arcs of two circles, that is, the first side 212a is formed by an arc C1a of a circle C1 and an arc C2a of a circle C2. By arranging the first side of the second sub-portion in the arc shape, the stress distribution in the second sub-portion changes more gently, which is beneficial for the second sub-portion to act as a stress buffer. With this design, the probability of generating cracks in the inorganic film layer of the flexible display panel is further reduced, and the performance reliability of the flexible display panel is improved.

Moreover, as shown in FIG. 7, the first sub-portion 211 has at least one second side 211a. The second side 211a is connected with the first side 212a at the boundary line L. A tangent of the first side 212a at a position where the first side 212a is connected with the boundary line L coincides with the second side 211a. That is, the first side 212a is smoothly connected with the second side 211a at the position where the second sub-portion 212 and the first sub-portion 211 are connected. Therefore, the stress concentration point at the boundary line between the second sub-portion 212 and the first sub-portion 211 can be avoided, such that stress distribution naturally transits at the boundary line, thereby reducing the probability of generating cracks in the inorganic film layer under stress and improving the performance reliability of the flexible display panel.

The first side of the second sub-portion may be a straight line.

Figure 12:
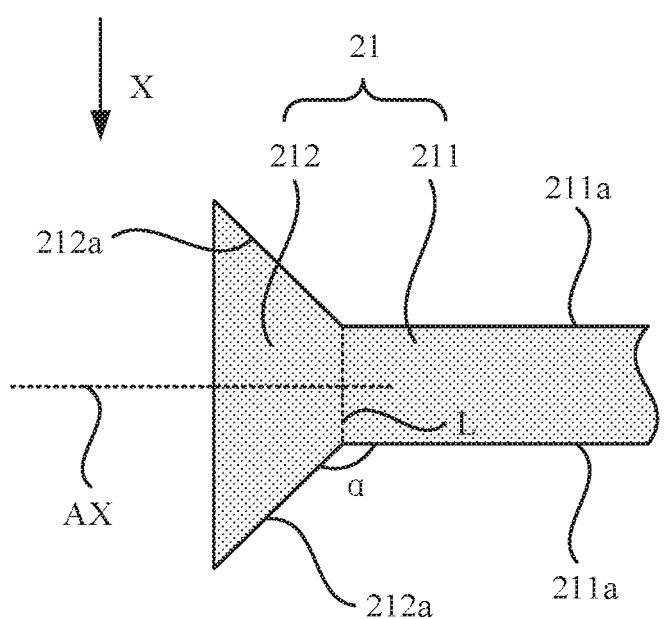
FIG. 12 is a partially schematic view of a first portion according to an embodiment of the present disclosure.

FIG. 12 is a partially schematic view of a first portion according to an embodiment of the present disclosure.

As shown in FIG. 12, the second sub-portion 212 has at least one first side 212a, the first sub-portion 211 has at least one second side 211a, the first side 212a is connected with the second side 211a at the boundary line L, the first side 212a is a straight line, and an angle between the first side 212a and the second side 211a meets: $90°<\alpha<180°$. The angle between the first side 212a and the second side 211a is an obtuse angle. When the flexible display panel is bended in the first direction X, near the boundary line L and in a direction from the first sub-portion 211 to the second sub-portion 212, the stress distribution on the first portion gradually changes. Compared with a case where the angle between the first side and second side is a right angle (see FIG. 8), the stress concentration degree and the stress distribution difference at the position where the first sub-portion and the second sub-portion are connected are reduced, the probability of generating cracks at the position where the first sub-portion and the second sub-portion are connected is reduced, which is beneficial for the second sub-portion to act as the stress buffer for the first sub-portion, so as to reduce the probability of generating cracks in the inorganic film layer under stress and improve the performance reliability of flexible display panel.

A case where the dimension of the second sub-portion gradually decreases is described as follows.

Figure 13:
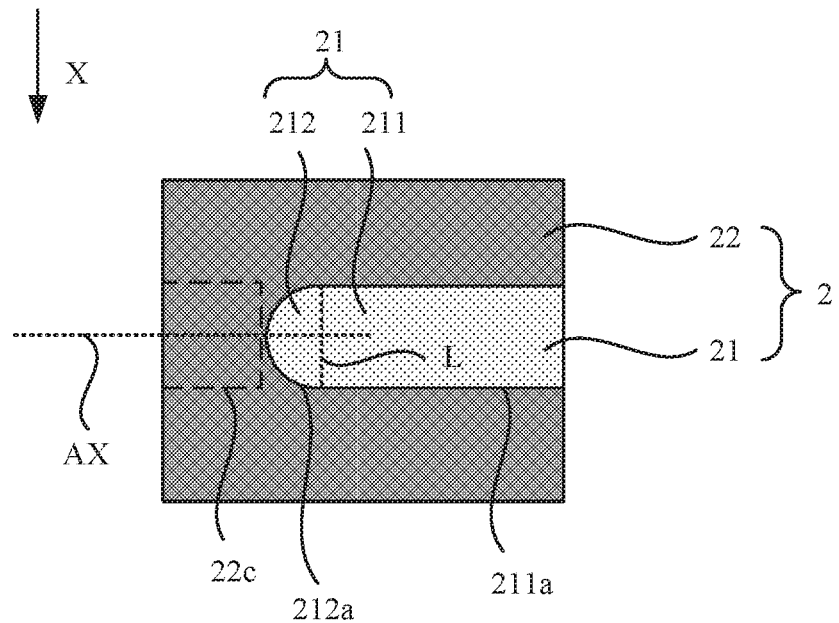
FIG. 13 is an enlarged view of a region D in FIG. 5.

FIG. 13 is an enlarged view of a region D in FIG. 5.

As shown in FIG. 5 and FIG. 13, the second sub-portion 212 is connected with the first sub-portion 211 in a direction perpendicular to the first direction X. The second portion 22 is connected with the first sub-portion 211 and the second sub-portion 212. The second portion 22 is located around the first portion 21 near the end of the first sub-portion 211. That is, the second portion 22 further includes a portion located on a side of the second sub-portion 212 away from the first sub-portion 211 (as shown by a second portion 22c in FIG. 13). From the boundary line L, the dimension of the second sub-portion 212 in the first direction X gradually decreases in the direction away from the first sub-portion 211. In a case that the flexible display panel is bended in the first direction X, the bending axle of the flexible display panel may extend in a direction parallel to the direction in which the first sub-portion extends. Since the thickness T2 of the second portion 22 is greater than the thickness T1 of the first portion 21, and in the direction of the bending axle of the flexible display panel, the stress received by the second portion 22c is substantially the same as the stress received by the first sub-portion 211. Therefore, a radius of curvature of the second portion 22c is greater than the radius of curvature of the first sub-portion 211. From the boundary line L, the dimension of the second sub-portion 212 between the first sub-portion 211 and the second portion 22c in the first direction X gradually decreases in the direction away from the first sub-portion 211. Correspondingly, the dimension of the second portion 22 in the first direction X gradually increases. As a transition region connecting the first sub-portion 211 and the second portion 22c, the radius of curvature of the second sub-portion 212 gradually increases in the direction away from the first sub-portion 211, and the stress received by the second sub-portion 212 gradually decreases in the direction away from the first sub-portion 211, thereby relieving the stress concentration at the edge of the inorganic film layer 2, near the end of the first sub-portion 211. In addition, the stress distribution difference at the position where the second sub-portion 212 is connected with the second portion 22 gradually decreases in the direction away from the first sub-portion 211, thereby reducing the stress distribution difference degree at the position where the first portion 21 and the second portion 22 are connected and eliminating the stress concentration point at this portion, which is beneficial to reduce the probability of generating cracks at the edge of the inorganic film layer 2 and improve the performance reliability of the flexible display panel.

Based on FIG. 5, a shape of the first side of the second sub-portion is described as follows.

As shown in FIG. 13, the second sub-portion 212 has at least one first side 212a. The first side 212a is connected with the boundary line L and has an arc shape. With this design, the stress distribution in the second sub-portion changes more gently, which is beneficial for the second sub-portion to act as a stress buffer, thereby further reducing the probability of generating cracks in the inorganic film layer of the flexible display panel and improving the performance reliability of the flexible display panel.

Figure 14:
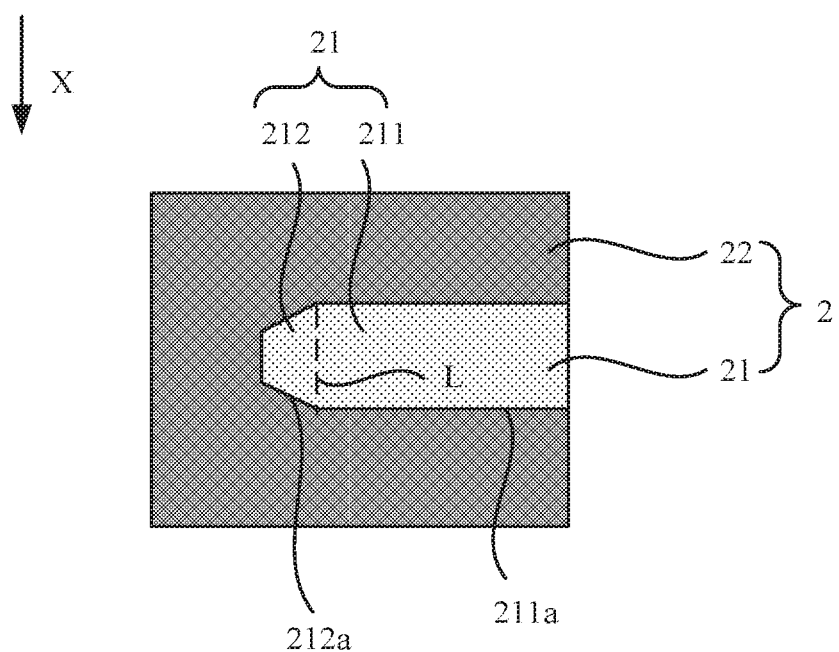
FIG. 14 is an enlarged view of a region D in FIG. 5.

FIG. 14 is an enlarged view of a region D in FIG. 5. The difference between FIG. 14 and FIG. 13 is that the first side 212a is the straight line and the angle between the first side 212a and the second side 211a meets: 90°<α<180°. The angle between the first side 212a and the second side 211a is an obtuse angle. When the flexible display panel is bended in the first direction X, near the boundary line L, in the direction from the first sub-portion 211 to the second sub-portion, the stress distribution on the first portion gradually changes. Compared with a case where the angle between the first side and second side is a right angle (see FIG. 8), the stress concentration degree and the stress distribution difference at the position where the first sub-portion is connected with the second sub-portion are reduced, the probability of generating cracks at the position where the first sub-portion is connected with the second sub-portion is reduced, which is beneficial for the second sub-portion to act as the stress buffer for the first sub-portion. Hence the probability of generating cracks in the inorganic film layer under the stress is reduced and the performance reliability of flexible display panel is improved.

In an embodiment of the present disclosure, the second sub-portion 212 has an axisymmetric shape, and the symmetry axis AX of the second sub-portion 212 is perpendicular to the first direction X. For example, as shown in FIG. 12 and FIG. 13, the second sub-portion 212 have an axisymmetric shape, such that the stress received by the second sub-portion 212 gradually changes on both sides of the symmetry axis, and balanced stress buffer can be provided, thereby further reducing the generation of cracks in the inorganic film layer 2 and improving the performance reliability of flexible display panel.

In an embodiment of the present disclosure, the second sub-portion may also have an asymmetric shape, and the shape of the second sub-portion can be determined based on implementation.

Figure 15:
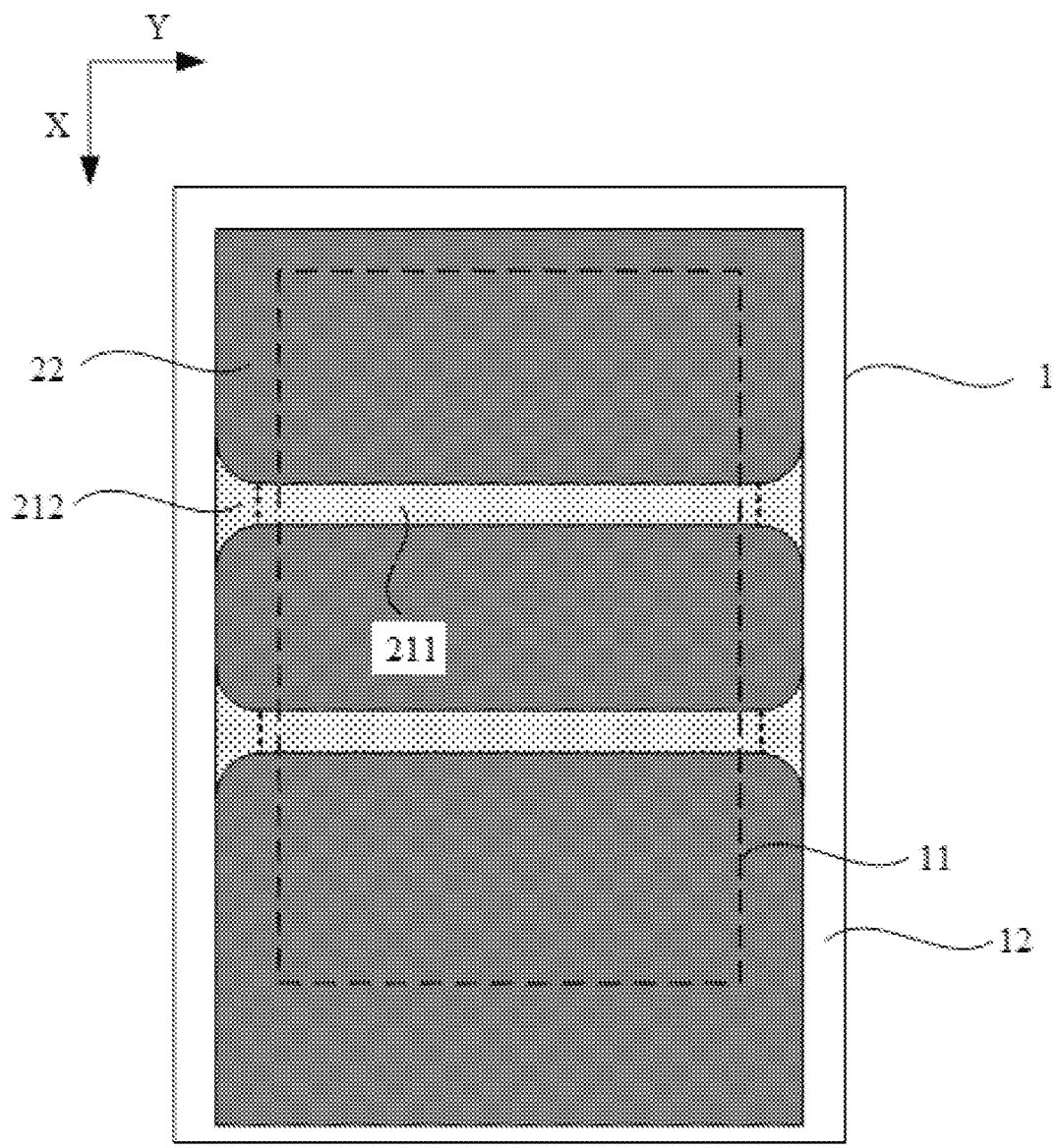
FIG. 15 is a top view of a flexible display panel according to an embodiment of the present disclosure.

FIG. 15 is a top view of a flexible display panel according to an embodiment of the present disclosure.

In an embodiment of the present disclosure, based on the above embodiments, as shown in FIG. 15, the flexible substrate 1 includes a display region 11 and a non-display region 12 surrounding the display region 11. The first sub-portion 211 is at least located in the display region 11, the number of first sub-portions 211 is at least two. The first sub-portions 211 extend in the second direction Y, and are arranged in the first direction X, where the second direction Y intersects with the first direction X. It should be noted that in the inorganic film layer, the second portion connected with the first portion is at least located in the display region, and the second portion can be used as at least one of an electrical insulating layer, a sealing layer and a buffer layer, and the second portion of the inorganic film layer may be patterned (not indicated in the drawings). For example, a via hole may be arranged in the second portion of the inorganic film layer such that the film layer located above the second portion is connected with the film layer located below the second portion through the via hole.

In one embodiment, the flexible substrate includes a display region and a non-display region surrounding the display region. The display region is a region in the flexible display panel used for displaying an image. In the display region, the flexible display panel may include multiple pixels. As an example, multiple pixels may include but not be limited to red pixels, blue pixels and green pixels, so as to achieve full color display. The non-display region is arranged around the display region. A signal wiring and a drive circuit may be arranged in the non-display region for providing signals for the pixels of the display region. As an example, the driving circuit may include a scanning shift register circuit.

The first sub-portion is at least located in the display region. The number of first sub-portions is at least two. The first sub-portions extend in the second direction and are arranged in the first direction. In a case that the flexible display panel is bended around a bending axle parallel to the second direction, the radius of curvature of the flexible display panel in a region where the first sub-portion is located is small, such that the flexible display panel have excellent bending performance. By arranging the at least two first sub-portions in parallel, the flexible display panel may have at least two positions where the radius of curvature is small, which is beneficial to realizing good bending, folding and curling performance of the flexible display panel.

The first sub-portions may be arranged in the flexible display panel at the following locations.

Figure 16:
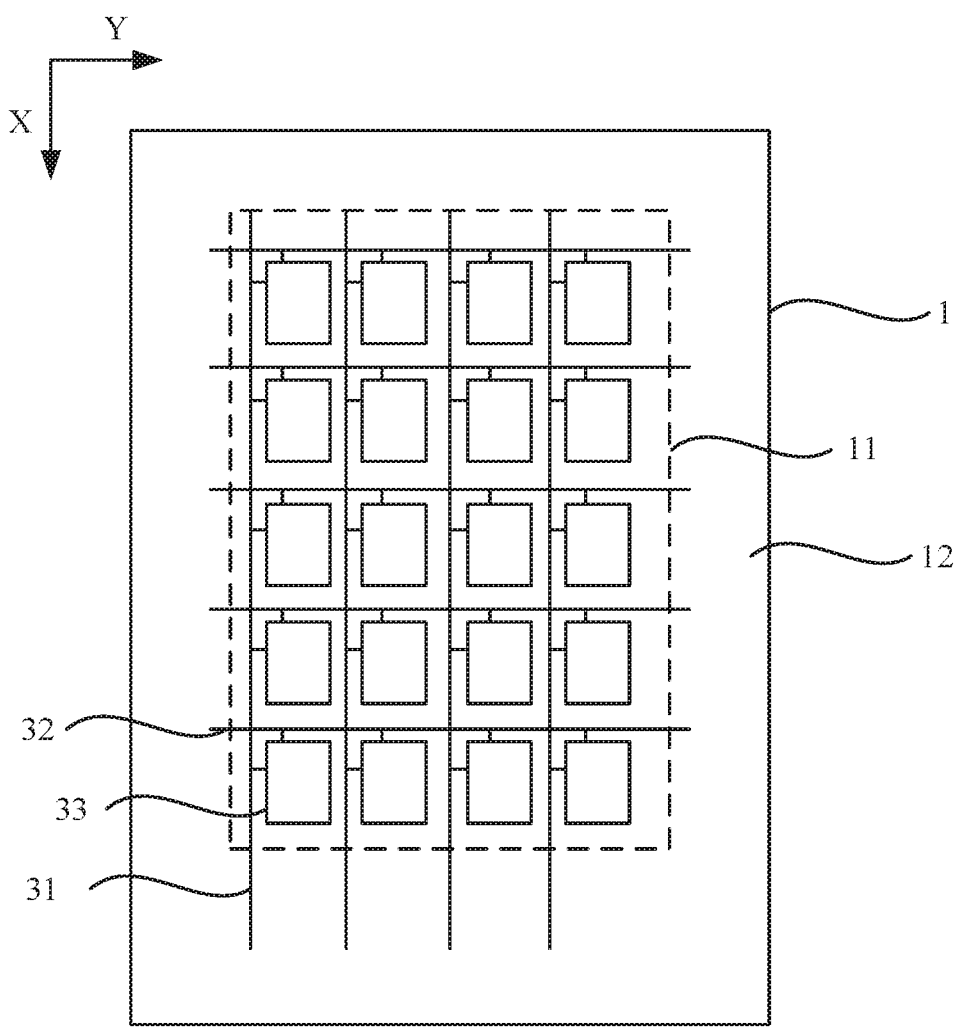
FIG. 16 is a top view of a flexible display panel according to an embodiment of the present disclosure.

FIG. 16 is a top view of a flexible display panel according to an embodiment of the present disclosure.

In an embodiment, as shown in FIG. 16, the flexible display panel may include multiple data lines 31 and multiple scanning lines 32. The data lines 31 extend in the first direction X, and the scanning lines 32 extend in the second direction Y. The multiple data lines 31 and the multiple scanning lines 32 intersect with each other to define multiple pixel regions, and a pixel circuit 33 is located in each of the pixel regions for controlling a luminescent element in the pixel region to emit light. The first sub-portion of the inorganic film layer may be arranged between two adjacent pixel circuit lines. In a case that the flexible display panel is bended, the region between the two adjacent pixel circuit lines has a small radius of curvature, and the region where the pixel circuit is located has a relatively great radius of curvature, which is beneficial to reducing impact of a bending action on performance and operation of the pixel circuit when the flexible display panel is bended. In addition, since an interval between the two adjacent pixel circuit lines is small, a width of the first sub-portion is small, and the end of the first sub-portion is prone to stress concentration. By connecting the first sub-portion with the second sub-portion having the gradually changing shape, the stress concentration at the end of the first sub-portion is effectively alleviated, the possibility of generating cracks at the end of the first sub-portion is reduced, and the performance reliability of the flexible display panel is ensured.

In another embodiment, the flexible display panel may be a foldable flexible display panel. The foldable flexible display panel includes a foldable region, where a folding axis is located in the foldable region, and the multiple first sub-portions may be arranged in the foldable region, where the multiple first sub-portions extend in the second direction and are arranged in the first direction, so as to improve the bending performance of the foldable region.

In another embodiment, the flexible display panel may be a rollable flexible display panel. In the rollable flexible display panel, multiple first sub-portions may be uniformly arranged in the display region or in the entire display panel, where the multiple first sub-portions extend in the second direction and are arranged in the first direction, such that a portion corresponding to the display region or the entire flexible display panel has good bending performance.

Figure 17:
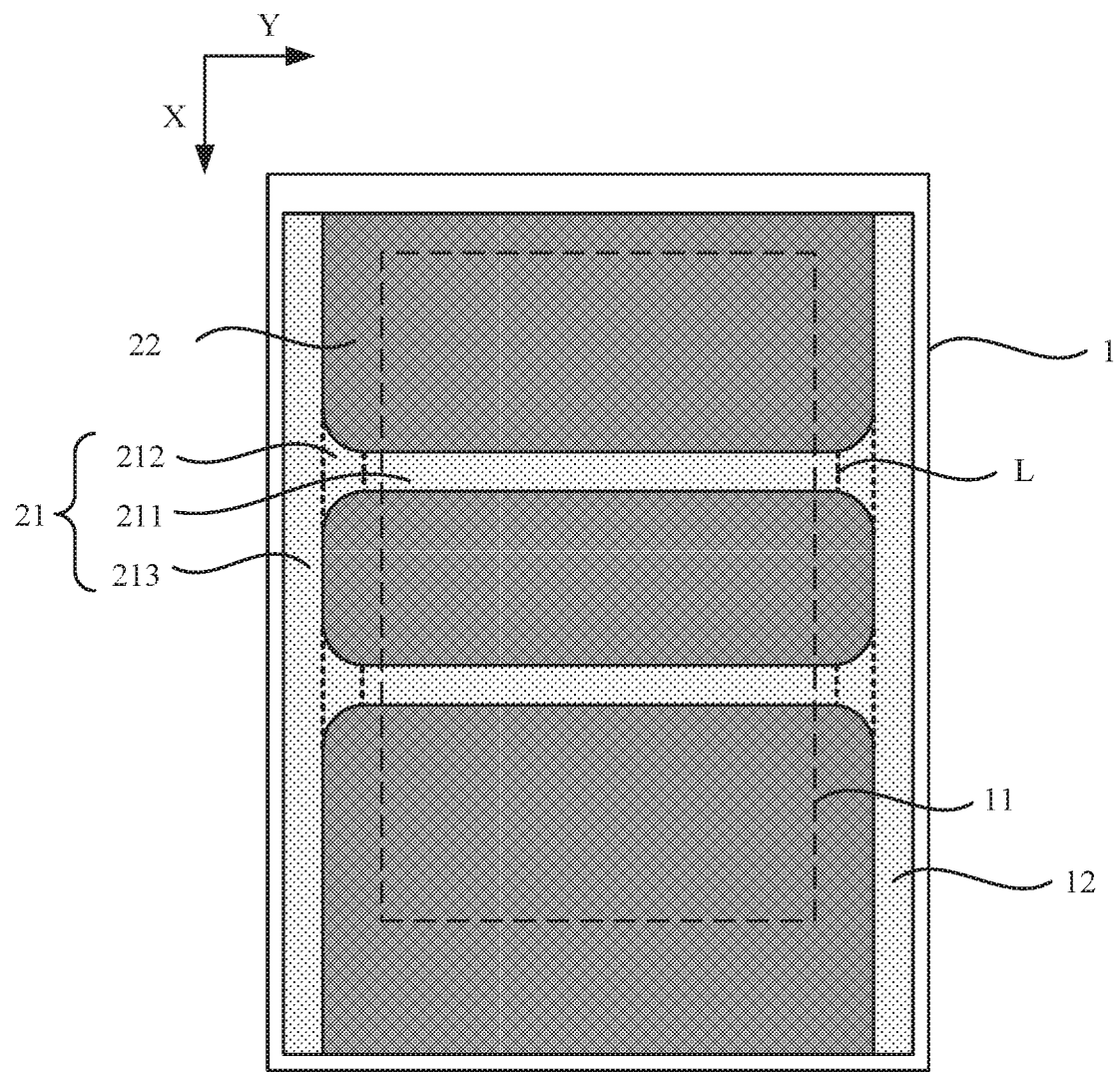
FIG. 17 is a top view of a flexible display panel according to an embodiment of the present disclosure.

FIG. 17 is a top view of a flexible display panel according to an embodiment of the present disclosure.

In an embodiment of the present disclosure, as shown in FIG. 17, a first portion 21 includes a first sub-portion 211, a second sub-portion 212 and at least one third sub-portion 213. The first sub-portion 211 is located at least in a display region 11, extends in a second direction Y and is arranged in the first direction X. The second sub-portion 212 has a shape having a gradually changing dimension. From the boundary line L, a dimension of the second sub-portion 212 in the first direction X gradually increases in a direction away from the first sub-portion 211. The third sub-portion 213 is located in the non-display region 12, and extends in the first direction X. The third sub-portion 213 is connected with the first sub-portion 211 via the second sub-portion 212. By arranging the third sub-portion which is connected with the second sub-portion, a stress buffer region at the edge of the inorganic film layer is enlarged, the remarkable stress distribution difference caused by the alternative arrangement of the second portion and the second sub-portion at the edge of the inorganic film layer may be improved compared with a case where the third sub-portion is not arranged, such that the stress is uniformly distributed at the edge of the inorganic film layer, thereby reducing the probability of generating cracks in the inorganic film layer and improving the performance reliability of the flexible display panel.

Two adjacent second sub-portions may be arranged in the following manners.

In an embodiment, with continued reference to FIG. 17, in the first direction X, two adjacent second sub-portions 212 may be arranged at an interval.

Figure 18:
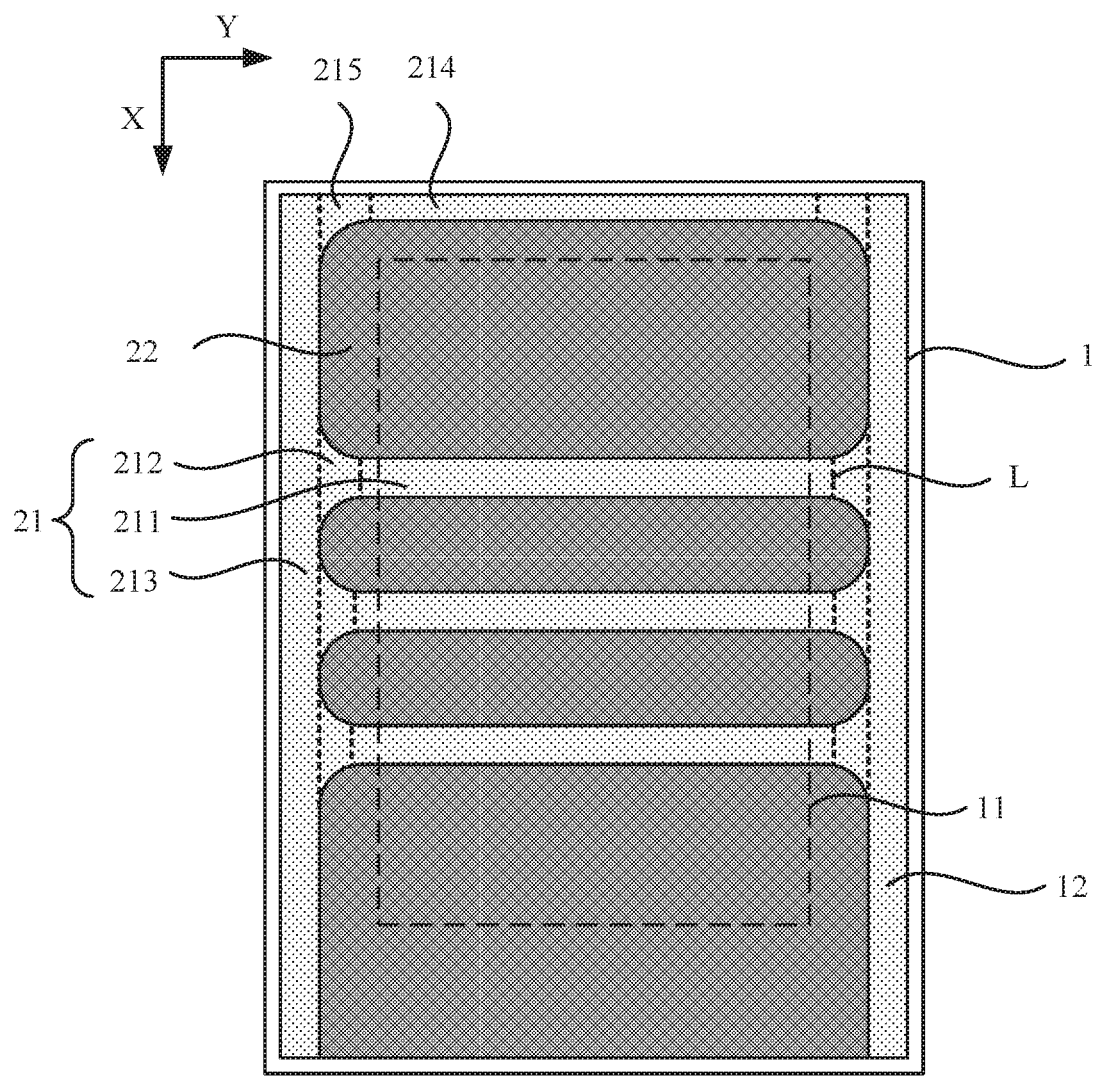
FIG. 18 is a top view of a flexible display panel according to an embodiment of the present disclosure.

FIG. 18 is a top view of a flexible display panel according to an embodiment of the present disclosure.

In another embodiment, as shown in FIG. 18, in the first direction X, the two adjacent second sub-portions 212 may be connected with each other. In the first direction X, the second portion 22 located between the two adjacent second sub-portions 212 also has a stress buffer region, and the first portion and the second portion are connected more gently at the edge of the inorganic film layer, which improves the stress distribution at the edge of the inorganic film layer, such that the probability of generating cracks in the inorganic film layer can be reduced and the performance reliability of the flexible display panel can be improved.

In an embodiment of the present disclosure, based on the above embodiment in which the third sub-portion is included, with continued reference to FIG. 18, the first portion 21 further includes at least one fourth sub-portion 214 and at least one fifth sub-portion 215. The fourth sub-portion 214 and the fifth sub-portion 215 are located in the non-display region 12. The fourth sub-portion 214 extends in the second direction Y, and is connected with the third sub-portion 213 via the fifth sub-portion 215. From a position where the fifth sub-portion 215 and the fourth sub-portion 214 are connected to a position where the fifth sub-portion 215 and the third sub-portion 213 are connected, a dimension of the fifth sub-portion 215 in the first direction X gradually increases. The third sub-portion, the fourth sub-portion and the fifth sub-portion are located on a side of the second portion away from the display region. The fourth sub-portion is connected with the third sub-portion via the fifth sub-portion, forming the edge of the inorganic film layer together. Meanwhile, by arranging the fifth sub-portion having a shape with a gradually changing dimension, the stress buffer region is formed at the corner of the inorganic film layer, the stress distribution at the edge and the corner of the inorganic film layer is adjusted, thereby reducing the probability of generating cracks at the edge and the corner of the inorganic film layer and improving the performance reliability of the flexible display panel.

In an embodiment of the present disclosure, based on the above embodiment in which the third sub-portion is included, reference is made to FIGS. 17 and 18, the first sub-portion 211 and the third sub-portion 213 are rectangular. The first sub-portion is rectangular such that stress in the first sub-portion is uniformly distributed in the second direction. The third sub-portion is rectangular such that stress is uniformly distributed at the edge of the inorganic film layer.

Figure 19:
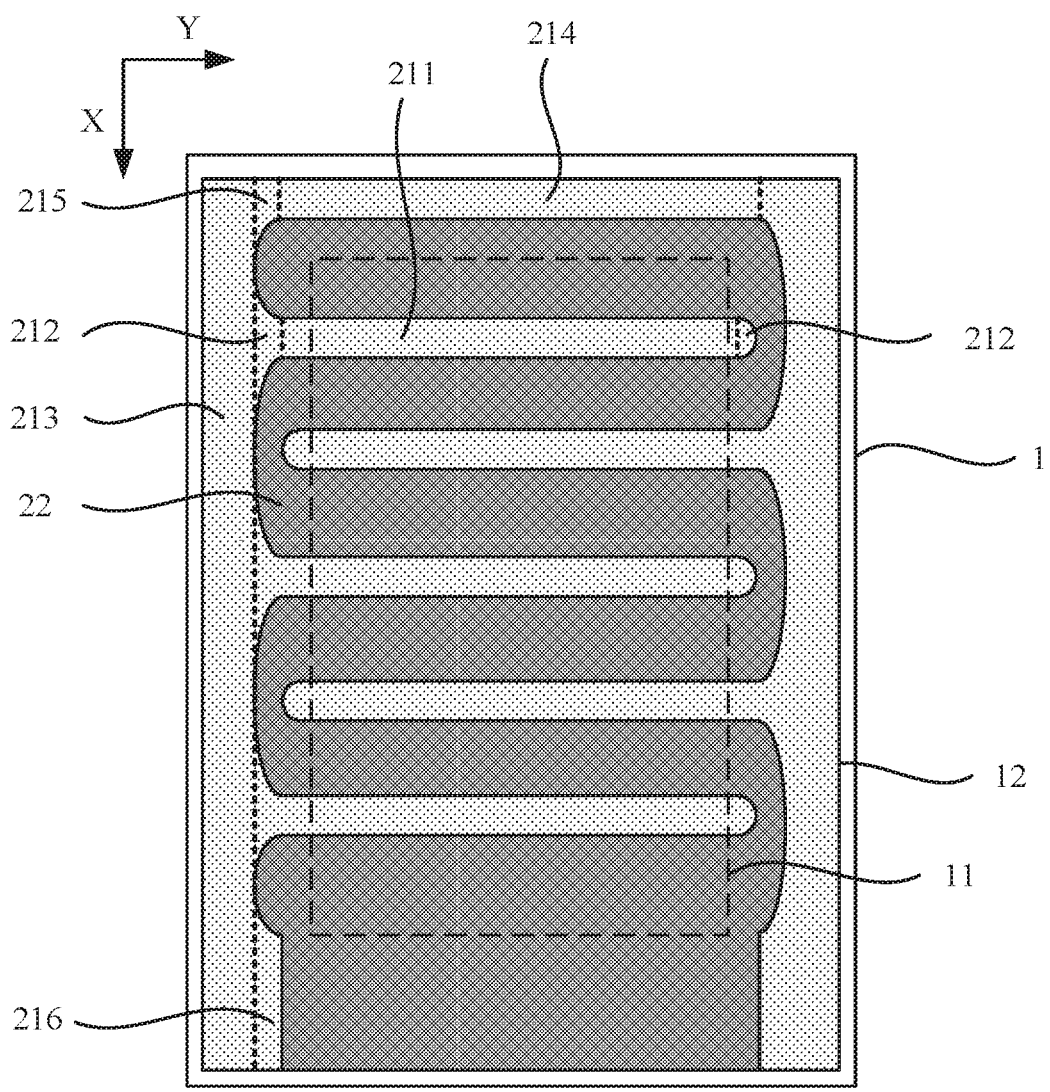
FIG. 19 is a top view of a flexible display panel according to an embodiment of the present disclosure.

FIG. 19 is a top view of a flexible display panel according to an embodiment of the present disclosure.

Based on the above embodiment in which the third sub-portion, the fourth sub-portion and the fifth sub-portion are included, in an embodiment of the present disclosure, reference is made to FIG. 19, the first sub-portion 211 has a first end E1 and a second end E2 opposite to each other. For the second sub-portion 212 connected with the first end E1, the dimension of the second sub-portion 212 in the first direction X gradually increases from the boundary line L in the direction away from the first sub-portion 211. For the second sub-portion 212 connected with the second end E2, the dimension of the second sub-portion 212 in the first direction X gradually decreases from the boundary line L in the direction away from the first sub-portion 211. In the first direction X, the first end E1 and the second end E2 are alternately arranged. With the above technical solution, on a basis of ensuring that the both ends of the first sub-portion each has a stress buffer portion, the second portion in the inorganic film layer is arranged in an S shape. That is, the second portion of the inorganic film layer includes multiple branches in the first direction, and the multiple branches are connected end to end, such that integrity of the second portion of the inorganic film layer is ensured while the stress distribution on the inorganic film layer is refined.

Moreover, as shown in FIG. 19, the first portion 21 of the inorganic film layer may further include a sixth sub-portion 216. In one embodiment, the non-display region of the flexible display panel includes a fan-shaped wiring region. The wiring in the display region may extend to the wiring fan-shaped region and be connected with an external drive circuit. The sixth sub-portion 216 may be connected with the third sub-portion 213 for increasing an area of the first portion having the smaller thickness on two sides of the fan-shaped region, such that a stress on an edge of the fan-shaped wiring region is reduced when the fan-shaped wiring region of the flexible display panel is bended to a back surface of the flexible display panel, thereby reducing the probability of generating cracks in the inorganic film layer and improving the performance reliability of the flexible display panel.

In an embodiment of the present disclosure, as shown in FIG. 6, the flexible display panel includes the flexible substrate 1 and the inorganic film layer 2 located on the flexible substrate 1. The inorganic film layer 2 includes the first portion 21 having the first thickness T1 and the second portion 22 having the second thickness T2. The first portion 21 is connected with the second portion 22, and T1<0.5*T2, such that the thickness of the first portion is much different from the thickness of the second portion. When the flexible display panel is bended, the radius of curvature of the first portion is smaller, such that the good bending performance of the flexible display panel may be achieved. At the same time, the radius of curvature of the second portion is greater, the circuit elements located in the region where the second portion is located may be protected so as to reduce the influence of bending of the flexible display panel to the circuit elements inside the flexible display panel.

Moreover, the first thickness of the first portion T1 is 0. That is, the inorganic film layer includes only the second portion, such that the difference between the radius of curvature of the first portion and the radius of curvature of the second portion may be further increased. In this case, the flexible display panel has good bending performance while the circuit elements can be protected. In addition, a corner of the second portion of the inorganic film layer has a gradually changing shape, with which the probability of generating cracks at the corner of the second portion can be reduced and the performance reliability of the flexible display panel can be improved.

Figure 20:
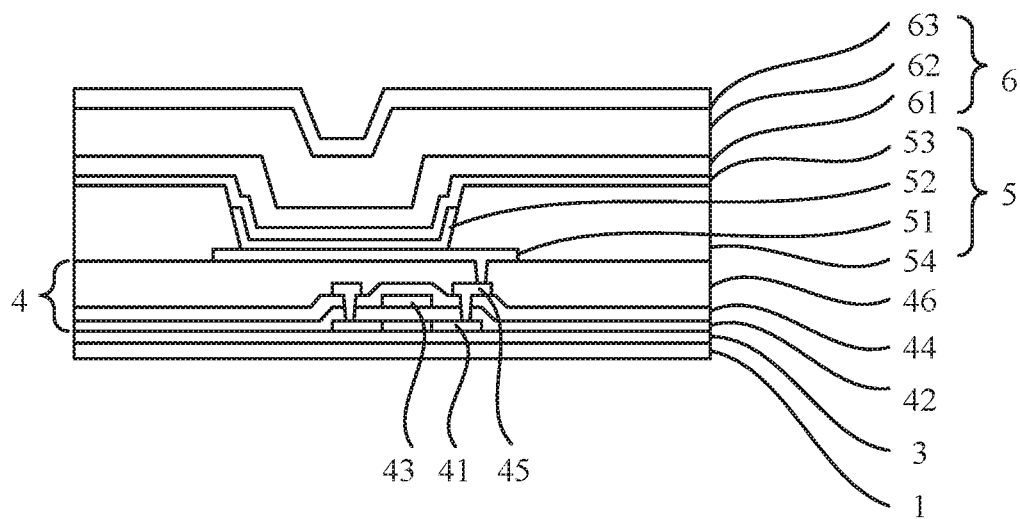
FIG. 20 is a cross-sectional view of a part of a display region of a flexible display panel according to an embodiment of the present disclosure.

FIG. 20 is a cross-sectional view of a part of a display region of a flexible display panel according to an embodiment of the present disclosure.

In an embodiment of the present disclosure, the flexible display panel includes the flexible substrate and the inorganic film layer. For specific definition of the flexible substrate and the inorganic film layer, reference may be made to the above embodiments, which is not repeated herein.

Moreover, as shown in FIG. 20, the flexible display panel further includes a buffer layer 3, a thin film transistor array layer 4, a light-emitting element layer 5 and a thin film encapsulation layer 6. The buffer layer 3 is located on the flexible substrate 1. The thin film transistor array layer 4 is located on a side of the buffer layer 3 away from the flexible substrate 1, and the thin film transistor array layer 4 includes an active layer 41, a gate insulating layer 42, a gate layer 43, an insulating interlayer 44 and a source-drain layer 45. The light-emitting element layer 5 is located on a side of the thin film transistor array layer 4 away from the flexible substrate 1. The thin film encapsulation layer 6 is located on a side of the light-emitting element layer 5 away from the thin film transistor array layer 4. The thin film encapsulation layer 6 covers the light-emitting element layer 5, and the thin film encapsulation layer 6 includes at least one first inorganic layer 61. The inorganic film layer 2 includes at least one of the buffer layer 3, the gate insulating layer 42, the insulating interlayer 44 and the first inorganic layer 61.

The thin film transistor array layer 4 includes multiple thin film transistors. The thin film transistor may form a pixel circuit for controlling light-emitting of the light-emitting element. The thin film transistor array layer 4 may further include a planarizing layer 46. The planarizing layer 46 is used for providing a flat surface for the light-emitting element layer 5 located above the planarizing layer 46.

The light-emitting element layer 5 may include multiple light-emitting elements. The light-emitting element includes an anode 51, an organic light-emitting layer 52 and a cathode 53 which are laminated with each other. In addition, the light-emitting element layer 5 may further include a pixel defining layer 54. The pixel defining layer 54 includes multiple openings, in which the light-emitting elements are located. In an embodiment of the present disclosure, the light-emitting element may be a miniature inorganic light-emitting diode.

The thin film encapsulation layer 6 covers the light-emitting element layer 5. The thin film encapsulation layer 6 may include the first inorganic layer 61, a first organic layer 62 and a second inorganic layer 63. The inorganic layer and the organic layer are laminated with each other, such that the stress in the inorganic layer can be alleviated and cracks in the inorganic layer can be prevented while ensuring that invasion of ambient moisture and oxygen can be prevented with the film encapsulation layer.

The inorganic layer 2 includes at least one of the buffer layer 3, the gate insulating layer 42, the insulating interlayer 44 and the first inorganic layer 61. In this case, on a basis of providing original functions of the film layer, the inorganic film layer may adjust and alleviate the stress on the edge of the inorganic film layer when the flexible display panel is bended, thereby reducing the probability of generating cracks and improving the performance reliability of the flexible display panel.

The inorganic film layer 2 described here is the inorganic film layer 2 described in FIGS. 4 to 7, FIGS. 9 to 15, FIGS. 17 to 19, and FIGS. 22 to 24.

In a case that the inorganic film layer 2 includes the first inorganic layer 61 in the thin film encapsulation layer 6, an influence of the inorganic film layer 2 on the thin film transistor array layer 4 may be reduced, and an influence of the inorganic film layer 2 on electronic elements and the wiring in the thin film transistor array layer 4 may be reduced. In addition, encapsulation performance is further improved by reducing the probability of generating cracks on the edge of the thin film encapsulation layer.

In a case that the inorganic film layer 2 is the gate insulating layer 42 or the insulating interlayer 44 in the thin film transistor array layer 4, the first portion of the inorganic film layer 2 may be arranged in the region which is not used for forming the thin film transistor, thereby reducing the influence of arrangement of the inorganic film layer on working performance of the thin film transistor.

In a case that the inorganic film layer 2 is the buffer layer 3, the arrangement of the inorganic film layer is beneficial for the buffer layer to act a better stress buffer.

In an embodiment of the present disclosure, the inorganic film layer 2 may be a laminated structure of multiple inorganic layers. A structure formed by multiple laminated layers may enhance contribution of the first portion in the inorganic film layer 2 to the good bending performance of the flexible display panel, such that the flexible display panel has the good bending performance.

Figure 21:
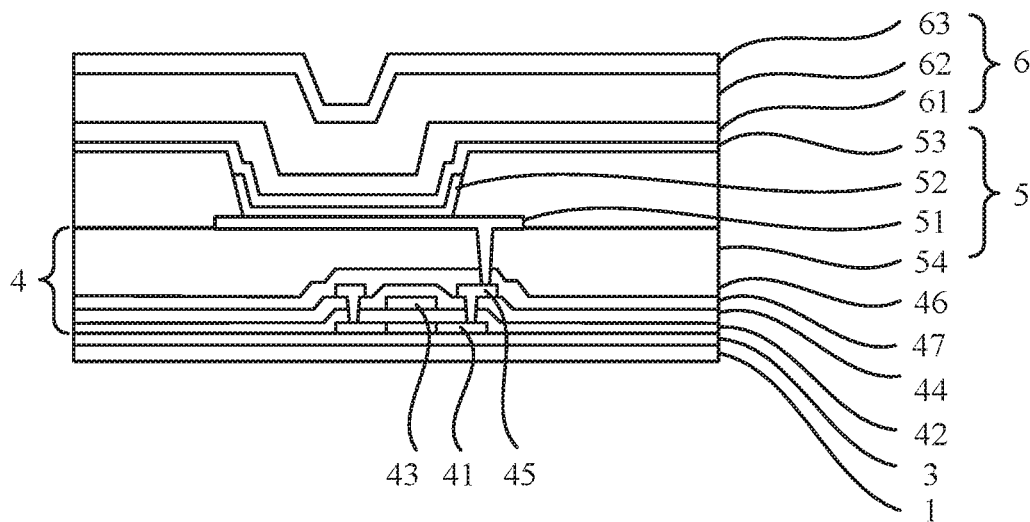
FIG. 21 is a cross-sectional view of a part of a display region of a flexible display panel according to an embodiment of the present disclosure.

FIG. 21 is a cross-sectional view of a part of a display region of a flexible display panel according to an embodiment of the present disclosure.

In an embodiment of the present disclosure, as shown in FIG. 21, the flexible display panel further includes the buffer layer 3, the thin film transistor array layer 4, the light-emitting element layer 5 and the thin film encapsulation layer 6. This embodiment differs from the embodiment corresponding to FIG. 20 in that, the thin film transistor array layer 4 further includes a passivation layer 47, which is located between the source drain layer 45 and the planarizing layer 46. The inorganic film layer 2 includes at least one of the buffer layer 3, the gate insulating layer 42, the insulating interlayer 44, the passivation layer 47 and the first inorganic layer 61. In this case, on a basis of providing the original function of the film layer, the inorganic film layer may adjust and alleviate the stress on the edge of the inorganic film layer when the flexible display panel is bended, thereby reducing the probability of generating cracks and improving the performance reliability of the flexible display panel.

Figure 22:
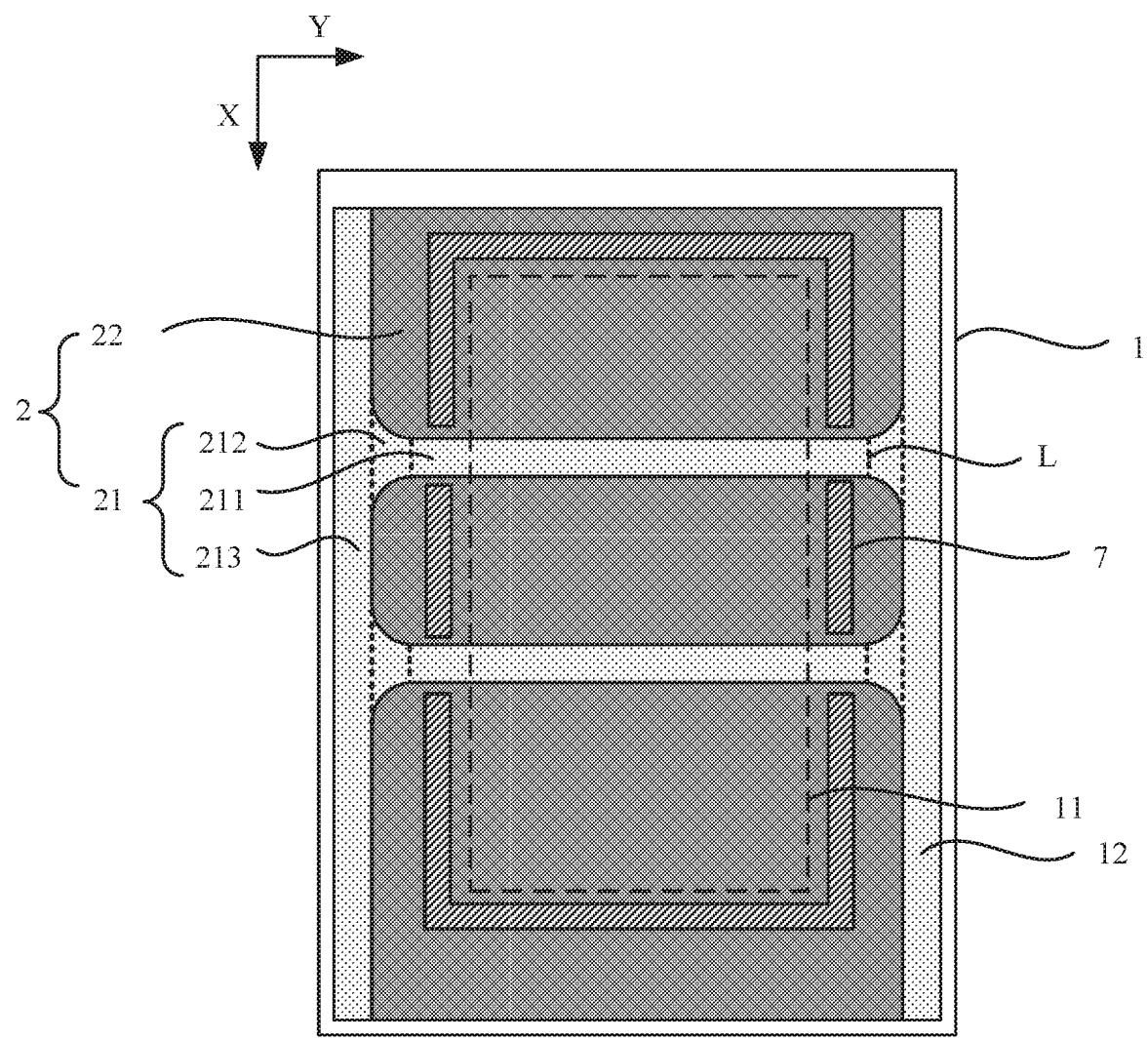
FIG. 22 is a top view of a flexible display panel according to an embodiment of the present disclosure.

FIG. 22 is a top view of a flexible display panel according to an embodiment of the present disclosure.

In an embodiment of the present disclosure, as shown in FIG. 22, the flexible display panel includes the flexible substrate and the inorganic film layer. For the description of the flexible substrate and the inorganic film layer, reference may be made to above embodiments. Moreover, the flexible display panel further includes a retaining wall 7, which is located on a side of the flexible substrate 1 close to the inorganic film layer 2 and surrounds the display region 11. Further, the retaining wall 7 is located on a side of the third sub-portion 213 close the display region 11, and is disconnected in a region where the first portion 21 is located. In one embodiment, the retaining wall may block the organic layer in the thin film encapsulation layer. Since the radius of curvature of the first portion is smaller when the flexible display panel is bended, the retaining wall is set to be disconnected in region where the first portion is located so as to prevent the radius of curvature of the retaining wall from being too small, thereby avoiding generation of the stress concentration point on the film layer covered on the retaining wall, reducing the generation of cracks and improving the performance reliability of the flexible display panel.

It should be noted that in FIGS. 17 to 19 and FIG. 22, the third sub-portion 213 is included. It may be understood that the first portion 21 may not include the third sub-portion 213 in the embodiment shown in FIGS. 17 to 19 and FIG. 22.

Figure 23:
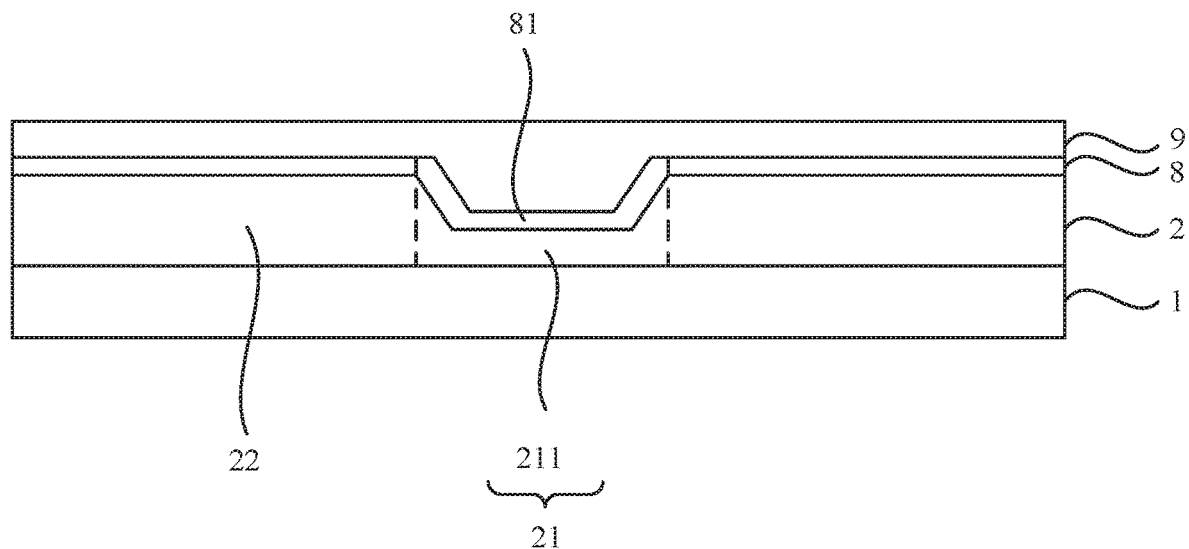
FIG. 23 is a cross-sectional view of a part of a flexible display panel according to an embodiment of the present disclosure.

FIG. 23 is a cross-sectional view of a part of a flexible display panel according to an embodiment of the present disclosure.

In an embodiment of the present disclosure, as shown in FIG. 23, the flexible display panel includes the flexible substrate 1 and the inorganic film layer 2. For the description of the flexible substrate 1 and the inorganic film layer 2, reference may be made to above embodiments. Moreover, the flexible display panel further includes a metal wiring 8, which is located on a side of the inorganic film layer 2 away from flexible substrate 1. The metal wiring 8 extends in a direction which is different from the direction in which the first sub-portion 211 extends. The metal wiring 8 includes a first metal wiring 81 that overlaps with the first sub-portion 211. The first metal wiring 81 is made of at least one of Titanium, Aluminum and Copper. The metal wiring formed by at least one of the Titanium, the Aluminum and the Copper exhibits excellent extensibility, such that the first metal wiring does not broke in a case that the first portion has a small radius of curvature.

Moreover, a covering layer 9 may be provided on a side of the metal wiring away from the flexible substrate. The covering layer 9 may be an organic insulating layer or an inorganic insulating layer.

Figure 24:
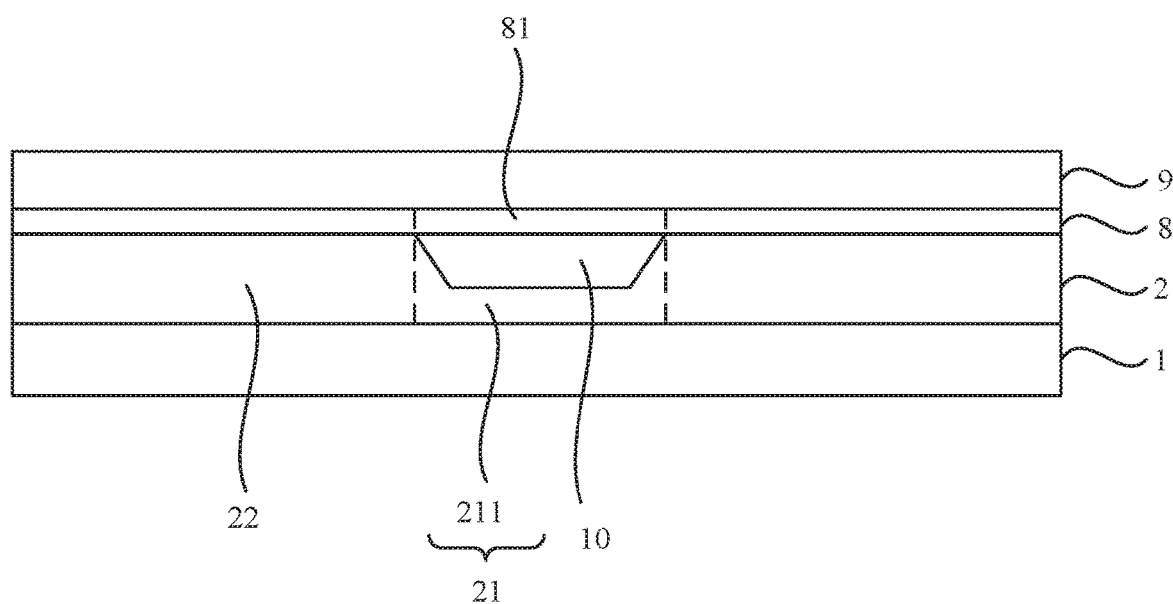
FIG. 24 is a cross-sectional view of a part of a flexible display panel according to an embodiment of the present disclosure.

FIG. 24 is a cross-sectional view of a part of a flexible display panel according to an embodiment of the present disclosure.

In an embodiment of the present disclosure, as shown in FIG. 24, the flexible display panel includes the flexible substrate 1 and the inorganic film layer 2. For the description of the flexible substrate 1 and the inorganic film layer 2, reference may be made to above embodiments. Moreover, the flexible display panel further includes the metal wiring 8, which is located on a side of the inorganic film layer 2 away from flexible substrate 1. The metal wiring 8 extends in a direction which is different from the direction in which the first sub-portion 211 extends. The metal wiring 8 includes the first metal wiring 81 that overlaps with the first sub-portion 211. An organic film layer 10 is arranged between the first metal wiring 81 and the first sub-portion 211 for buffering a stress in the first metal wiring and preventing breakage of the first metal wiring.

It should be noted that the above metal wiring may be any one of a data line, a scanning line, a power supply line, a ground line and other signal lines in the flexible display panel.

It should be noted that the position of the inorganic film layer where the first portion and the second portion are connected may be further provided with a transition region. In the transition region, the thickness of the inorganic film layer gradually changes. Reference may be made to FIGS. 23 and 24.

Figure 25:
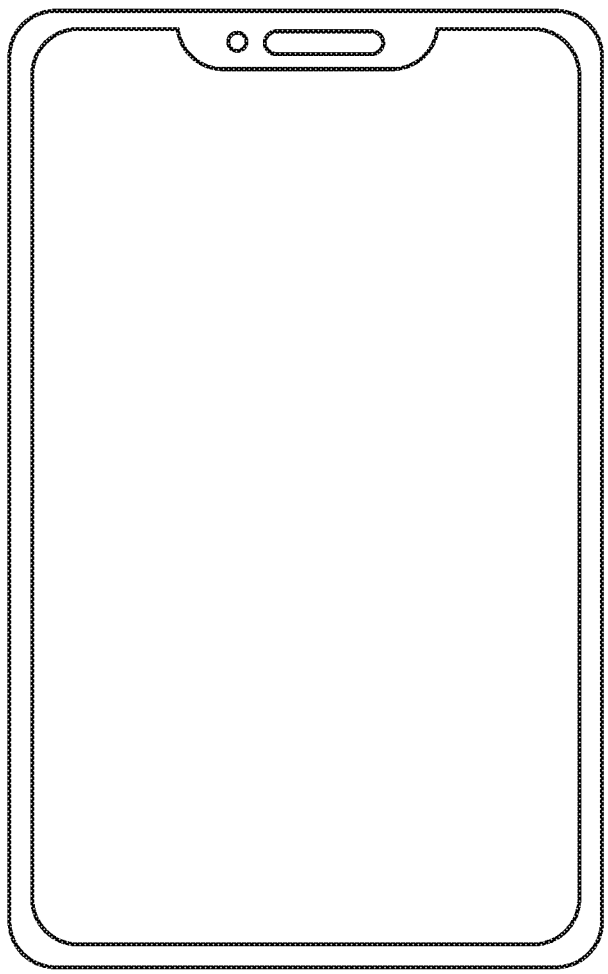
FIG. 25 is a schematic diagram of a display device according to an embodiment of the present disclosure.

A display device is further provided according to the embodiments of the present disclosure. The display device may include the flexible display panel provided according to any one of the above embodiments. In one embodiment, the display device may be any electronic product with a display function, including but not limited to: a television, a laptop computer, a desktop display, a tablet computer, a digital camera, a mobile phone, a smart bracelet, a pair of smart glasses, an on-board display, medical equipment, industrial control equipment, a touch interactive terminal, etc. Moreover, the display device may be a curved surface display device or a foldable display device. FIG. 25 is a schematic diagram of a display device according to an embodiment of the present disclosure. FIG. 25 shows a case where the display device of the present disclosure is a mobile phone. The flexible display panel in the display device provided according to the embodiments has features recorded in any one of the above embodiments.

The invention claimed is:

1. A flexible display panel, comprising:
   a flexible substrate; and
   an inorganic film layer located on the flexible substrate, wherein
   the inorganic film layer comprises a first portion and a second portion, the first portion is connected with the second portion, the first portion has a first thickness T1, the second portion has a second thickness T2, and T1<T2, and
   the first portion comprises at least one first sub-portion and at least one second sub-portion, the first sub-portion is connected with the second sub-portion at a boundary line extending in a first direction, a length of an end of the first sub-portion at the boundary line in first direction is the same as a length of an end of the second sub-portion at the boundary line in the first direction such that the end of the first sub-portion smoothly joins with the end of the second sub-portion at the boundary line, and from the boundary line, a dimension of the second sub-portion in the first direction gradually changes in a direction away from the first sub-portion.

2. The flexible display panel according to claim 1, wherein
   from the boundary line, the dimension of the second sub-portion in the first direction gradually increases in the direction away from the first sub-portion.

3. The flexible display panel according to claim 2, wherein
   the second sub-portion has at least one first side, the first side is connected with the boundary line and has an arc shape.

4. The flexible display panel according to claim 3, wherein
   the first sub-portion has at least one second side, the second side is connected with the first side at the boundary line, and a tangent of the first side at a position at which the first side is connected with the boundary line coincide with the second side.

5. The flexible display panel according to claim 2, wherein
the second sub-portion has at least one first side, the first sub-portion has at least one second side, the first side is connected with the second side at the boundary line, the first side is a straight line, and an angle α between the first side and the second side meets: 90°<α<180°.

6. The flexible display panel according to claim 1, wherein
from the boundary line, the dimension of the second sub-portion in the first direction gradually decreases in the direction away from the first sub-portion, and
the second sub-portion has at least one first side, the first side is connected with the boundary line and has an arc shape.

7. The flexible display panel according to claim 1, wherein
the second sub-portion has an axisymmetric shape, and a symmetry axis of the second sub-portion is perpendicular to the first direction.

8. The flexible display panel according to claim 1, wherein
the flexible substrate comprises a display region and a non-display region surrounding the display region, and
the first sub-portion is located at least in the display region, the number of first sub-portions is at least two, the at least two first sub-portions extend in a second direction and are arranged in the first direction, and the second direction intersects with the first direction.

9. The flexible display panel according to claim 8, wherein
the first portion further comprises at least one third sub-portion, the third sub-portion is located in the non-display region and extends in the first direction,
from the boundary line, the dimension of the second sub-portion in the first direction gradually increases in the direction away from the first sub-portion, and
the first sub-portion is connected with the third sub-portion via the second sub-portion.

10. The flexible display panel according to claim 9, wherein
the first portion further comprises at least one fourth sub-portion and at least one fifth sub-portion, the fourth sub-portion and the fifth sub-portion are located in the non-display region, and the fourth sub-portion extends in the second direction,
the fourth sub-portion is connected with the third sub-portion via the fifth sub-portion, and
from a position at which the fifth sub-portion is connected with the fourth sub-portion to a position at which the fifth sub-portion is connected with the third sub-portion, a dimension of the fifth sub-portion in the first direction gradually increases.

11. The flexible display panel according to claim 9, wherein
each of the first sub-portion and the third sub-portion has a rectangular shape.

12. The flexible display panel according to claim 8, wherein
the first sub-portion has a first end and a second end which are opposite to each other,
from the boundary line, a dimension of the second sub-portion connected with the first end in the first direction gradually increases in the direction away from the first sub-portion, from the boundary line, a dimension of the second sub-portion connected with the second end in the first direction gradually decreases in the direction away from the first sub-portion, and
the first end and the second end are alternately arranged in the first direction.

13. The flexible display panel according to claim 1, wherein T1<0.5*T2.

14. The flexible display panel according to claim 1, wherein
the flexible display panel further comprises a buffer layer, a thin film transistor array layer, a light-emitting element layer and a thin film encapsulation layer,
the buffer layer is located on the flexible substrate,
the thin film transistor array layer is located on a side of the buffer layer away from the flexible substrate, and the thin film transistor array layer comprises an active layer, a gate insulating layer, a gate layer, an insulating interlayer and a source-drain layer,
the light-emitting element layer is located on a side of the thin film transistor array layer away from the flexible substrate,
the thin film encapsulation layer is located on a side of the light-emitting element layer away from the thin film transistor array layer, the thin film encapsulation layer covers the light-emitting element layer, and the thin film encapsulation layer comprises at least one first inorganic layer, and
the inorganic film layer comprises at least one of the buffer layer, the gate insulating layer, the insulating interlayer and the first inorganic layer.

15. The flexible display panel according to claim 1, wherein
the flexible display panel further comprises a buffer layer, a thin film transistor array layer, a light-emitting element layer and a thin film encapsulation layer,
the buffer layer is located on the flexible substrate,
the thin film transistor array layer is located on a side of the buffer layer away from the flexible substrate, and the thin film transistor array layer comprises an active layer, a gate insulating layer, a gate layer, an insulating interlayer, a source-drain layer and a passivation layer,
the light-emitting element layer is located on a side of the thin film transistor array layer away from the flexible substrate,
the thin film encapsulation layer is located on a side of the light-emitting element layer away from the thin film transistor array layer, the thin film encapsulation layer covers the light-emitting element layer, and the thin film encapsulation layer comprises the at least one first inorganic layer, and
the inorganic film layer comprises at least one of the buffer layer, the gate insulating layer, the insulating interlayer, the passivation layer and the first inorganic layer.

16. The flexible display panel according to claim 9, wherein
the flexible display panel further comprises a retaining wall, which is located on a side of the flexible substrate close to the inorganic film layer and surrounds the display region, and is located on a side of the third sub-portion close the display region, and
the retaining wall is disconnected in a region at which the first portion is located.

17. The flexible display panel according to claim 1, wherein the flexible display panel further comprises a metal wiring, which is located on a side of the inorganic film layer away from flexible substrate, the metal wiring extends in a direction which is different from the direction in which the first sub-portion extends, the metal wiring comprises a first metal wiring that overlaps with the first sub-portion, and the first metal wiring is made of at least one of Titanium, Aluminum and Copper.

18. The flexible display panel according to claim 1, wherein the flexible display panel further comprises a metal wiring, which is located on a side of the inorganic film layer away from flexible substrate, the metal wiring extends in a direction which is different from the direction in which the first sub-portion extends, the metal wiring comprises a first metal wiring that overlaps with the first sub-portion, and an organic film layer is arranged between the first metal wiring and the first sub-portion.

19. A display device, comprising a flexible display panel, wherein the flexible display panel comprises a flexible substrate and an inorganic film layer located on the flexible substrate, the inorganic film layer comprises a first portion and a second portion, the first portion is connected with the second portion, the first portion has a first thickness T1, the second portion has a second thickness T2, and T1<T2, and the first portion comprises at least one first sub-portion and at least one second sub-portion, the first sub-portion is connected with the second sub-portion at a boundary line extending in a first direction, a length of an end of the first sub-portion at the boundary line in first direction is the same as a length of an end of the second sub-portion at the boundary line in the first direction such that the end of the first sub-portion smoothly joins with the end of the second sub-portion at the boundary line, and from the boundary line, a dimension of the second sub-portion in the first direction gradually changes in a direction away from the first sub-portion.

\* \* \* \* \*